United States Patent
Shimoda et al.

(10) Patent No.: US 6,846,703 B2
(45) Date of Patent: Jan. 25, 2005

(54) THREE-DIMENSIONAL DEVICE

(75) Inventors: Tatsuya Shimoda, Suwa-gun (JP);
Satoshi Inoue, Chino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/403,543

(22) PCT Filed: Feb. 24, 1999

(86) PCT No.: PCT/JP99/00864
§ 371 (c)(1),
(2), (4) Date: Oct. 25, 1999

(87) PCT Pub. No.: WO99/45593
PCT Pub. Date: Sep. 10, 1999

(65) Prior Publication Data
US 2003/0057423 A1 Mar. 27, 2003

(30) Foreign Application Priority Data
Mar. 2, 1998 (JP) ............................. 10-049883

(51) Int. Cl.[7] .............................................. H01L 25/00
(52) U.S. Cl. ..................... 438/109; 438/455; 438/459; 438/977
(58) Field of Search ................................ 438/109, 455, 438/459, 977, FOR 107, FOR 485, FOR 477, FOR 426; 257/67, 231, 278, 433

(56) References Cited
U.S. PATENT DOCUMENTS

| | | | | |
|---|---|---|---|---|
| 4,939,568 A | | 7/1990 | Kato et al. | |
| 5,087,585 A | * | 2/1992 | Hayashi | 438/155 |
| 5,499,124 A | * | 3/1996 | Vu et al. | 349/122 |
| 5,656,548 A | * | 8/1997 | Zavracky et al. | 438/23 |
| 5,736,768 A | * | 4/1998 | Zavracky et al. | 257/347 |
| 5,819,406 A | * | 10/1998 | Yoshizawa et al. | 29/877 |
| 2001/0012677 A1 | * | 8/2001 | Sameshima | 438/458 |

FOREIGN PATENT DOCUMENTS

| | | |
|---|---|---|
| JP | A-61-99362 | 5/1986 |
| JP | A-62-145760 | 6/1987 |
| JP | A-62-219954 | 9/1987 |
| JP | 402285678 A * | 11/1990 |
| JP | A-7-78938 | 3/1995 |
| JP | A-8-125120 | 5/1996 |
| JP | A-10-125929 | 5/1998 |
| JP | A-10-335577 | 12/1998 |

* cited by examiner

*Primary Examiner*—George Fourson
(74) *Attorney, Agent, or Firm*—Oliff & Berridge, PLC

(57) ABSTRACT

A memory IC includes a first substrate (substrate on the transfer destination side), and memory cell arrays deposited on the first substrate. The memory cell arrays are deposited from the bottom up by a method for transferring a thin film configuration. The transferring method includes the steps of forming a thin film device layer (memory cell array) on a second substrate with a separable layer therebetween, and irradiating the separable layer with light to cause a separation in the separable layer and/or at an interface so that the thin film device layer on the second substrate is transferred to the first substrate.

27 Claims, 17 Drawing Sheets

OPTICAL SIGNAL (LIGHT)

OPTICAL SIGNAL (LIGHT)

THREE-DIMENSIONAL DEVICE

BACKGROUND OF THE INVENTION

1. Field of the Invention

The present invention relates to three-dimensional devices.

2. Description of Related Art

Conventional three-dimensional devices such as three-dimensional ICs are fabricated in a manner described below. First, a first layer including a field effect transistor (FET) and the like is formed on an Si substrate through many steps. Next, on the first layer, a similar second layer is formed. A third layer and subsequent layers are formed in a similar manner.

However, in a conventional three-dimensional device, since the individual layers are superposed in sequence on the same substrate, an upper layer must be formed so as not to adversely affect a lower layer, and there are various constraints during fabrication (such as the upper temperature limit to prevent alteration of lower layers).

In the case of a three-dimensional device in which different layers are deposited, it is very difficult to form the individual layers with suitable device parameters (for example, gate-line width, thickness of a gate insulating film, design rules, and fabrication conditions such as temperature during fabrication).

In a conventional three-dimensional device, since the individual layers are formed on a substrate constituting the device, the substrate used must comply with the requirements both for a device substrate and for a substrate for forming individual layers. Thus, only specific substrates can be used, which is disadvantageous.

For the reasons described above, use of three-dimensional devices such as three-dimensional ICs has not yet been implemented.

SUMMARY OF THE INVENTION

It is an object of the present invention to provide a high-performance three-dimensional device in which thin film device layers can be formed easily with versatility.

Such an object is achieved in accordance with the present invention as described in the following embodiments (1) to (20).

(1) A three-dimensional device including a plurality of thin film device layers deposited in the thickness direction, each thin film device layer being disposed in a predetermined region in the planar direction, in which at least one of the thin film device layers is deposited by a transfer method.

(2) A three-dimensional device including a plurality of thin film device layers deposited on a base in the thickness direction for constituting a three-dimensional circuit, each thin film device layer constituting a circuit disposed in a predetermined region extending in the planar direction, in which at least one of the thin film device layers is deposited by a transfer method.

(3) The three-dimensional device according to one of (1) and (2), in which the transfer method includes the steps of forming a thin film device layer on a support substrate with a separable layer therebetween, and irradiating the separable layer with light to cause a separation in the separable layer and/or at an interface so that the thin film device layer on the support substrate is transferred to a substrate of the three-dimensional device.

(4) The three-dimensional device according to (3), in which the separation of the separable layer is caused by the breakage or weakening of interatomic or intermolecular bonds in a material constituting the separable layer.

(5) The three-dimensional device according to (3), in which the separation of the separable layer is caused by the evolution of gas from material constituting the separable layer.

(6) The three-dimensional device according to any one of (3) to (5), in which the light is a laser beam.

(7) The three-dimensional device according to any one of (3) to (6), in which the separable layer is composed of amorphous silicon, ceramic, metal, or organic polymeric material.

(8) The three-dimensional device according to any one of (1) to (7), in which the thin film device layer includes connecting electrodes, the connecting electrodes electrically connecting two adjacent thin film device layers to each other.

(9) The three-dimensional device according to (8), in which the connecting electrodes are provided on both surfaces of the thin film device layer.

(10) The three-dimensional device according to one of (8) and (9), in which two adjacent thin film device layers are joined to each other with an anisotropic conductive film therebetween.

(11) The three-dimensional device according to any one of (1) to (7), in which in two selected layers of the thin film device layers, one layer has a light-emitting section and the other layer has a light-receiving section, and the light-emitting section and the light-receiving section enable optical communication between the two layers.

(12) The three-dimensional device according to any one of (1) to (11), in which the thin film device layer deposited by transferring is formed simultaneously with at least one of the other thin film device layers.

(13) The three-dimensional device according to any one of (1) to (12), in which at least one of the thin film device layers has a plurality of thin film transistors.

(14) The three-dimensional device according to any one of (1) to (13), in which at least one of the thin film device layers includes a memory cell array.

(15) The three-dimensional device according to any one of (1) to (14), in which a plurality of layers among the thin film device layers constitute one memory.

(16) The three-dimensional device according to any one of (1) to (13), in which at least one of the thin film device layers includes a memory cell array and at least one of the other thin film device layers includes a logic circuit.

(17) The three-dimensional device according to (16), in which the logic circuit drives the memory cell array.

(18) The three-dimensional device according to one of (16) and (17), in which the logic circuit and the memory cell array are formed in accordance with different design rules.

(19) The three-dimensional device according to one of (16) and (17), in which the logic circuit and the memory cell array are formed in accordance with different design parameters.

(20) The three-dimensional device according to one of (16) and (17), in which the logic circuit and the memory cell array are formed by different fabricating processes.

DETAILED DESCRIPTION OF THE PREFERRED EMBODIMENTS

Three-dimensional devices in accordance with the present invention will be described in detail based on preferred examples shown in the attached drawings.

In the present invention, a three-dimensional device (such as a three-dimensional IC) is fabricated by depositing a plurality of layers using a "method for transferring a thin film configuration (transfer technique)", which will be described later. That is, the three-dimensional device in accordance with the present invention is a three-dimensional device in which a plurality of layers are deposited in the thickness direction using the "method for transferring a thin film configuration", which will be described later. First, the "method for transferring a thin film configuration" will be described.

FIGS. 1 to 8 are sectional views which schematically show steps of an example of a method for transferring a thin film configuration in the present invention. With reference to the drawings, the steps in the method for transferring a thin film configuration (separation method) will be described separately.

Figure 1:
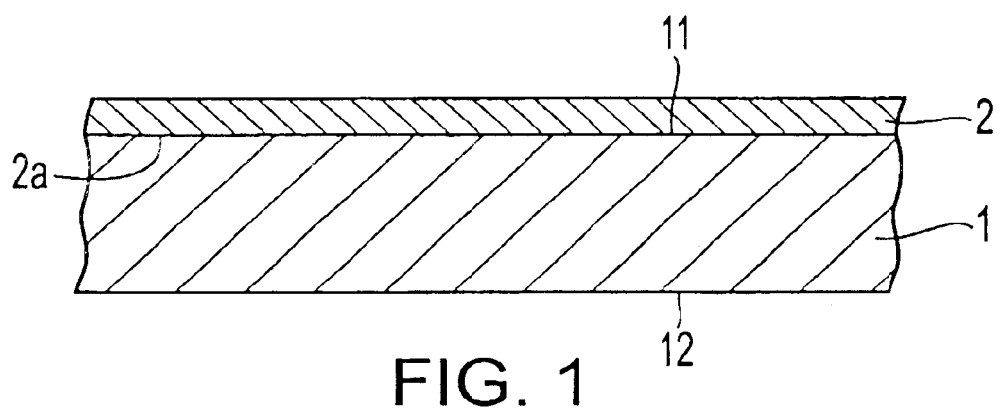
FIG. 1 is a sectional view which schematically shows steps of an example of a method for transferring a thin film configuration in the present invention.

(1) As shown in FIG. 1, a separable layer (light absorption layer) 2 is formed on a surface (separable layer-formation surface 11) of a substrate 1.

The substrate 1 is preferably transparent so that light 7 can pass through the substrate 1 when the light 7 is radiated from the side of the substrate 1.

The light 7 has a transmittance of, preferably, 10% or more, and more preferably, 50% or more. If the transmittance is too low, the attenuation (loss) of the light 7 increases, and a larger amount of light is required to separate the separable layer 2.

The substrate 1 is preferably composed of a highly reliable material, and in particular, it is preferably composed of a material having excellent heat resistance. The reason for this is that, for example, although the processing temperature may increase (e.g., by approximately 350 to 1,000° C.) depending on the types and the methods of formation when a transfer source layer 4 or an intermediate layer 3 (which will be described below) is formed, in such a case, if the substrate 1 is highly heat-resistant, the film-formation conditions such as temperature conditions can be set in a wider range during the formation of the transfer source layer 4 or the like on the substrate 1.

Therefore, given that the maximum temperature is Tmax during the formation of the transfer source layer 4, the substrate 1 is preferably composed of a material having a distortion point of Tmax or more. Specifically, the material for the substrate 1 has a distortion point of, preferably, 350° C. or more, and more preferably, 500° C. or more. Materials which meet the above requirements include heat resistant glasses such as quartz glass, soda glass, Corning 7059, and Nippon Electric Glass OA-2.

If the processing temperature during the formation of the separable layer 2, an intermediate layer 3, and the transfer source layer 4 (which will be described below) is decreased, inexpensive glass materials having a low melting point or synthetic resins may be used as the substrate 1.

Although there is no limitation of the thickness of the substrate 1, generally, the substrate 1 has a thickness of, preferably, approximately 0.1 to 5.0 mm, and more preferably, approximately 0.5 to 1.5 mm. If the thickness of the substrate 1 is too small, the strength is decreased, and if the thickness of the substrate 1 is too large, the light 7 is easily attenuated when the substrate 1 has a low transmittance. Additionally, when the substrate 1 has a high transmittance toward the light 7, the thickness thereof may exceed the upper limit described above.

Preferably, the substrate 1 has a uniform thickness so that the section on which the separable layer is formed is uniformly irradiated with the light 7.

The separable layer-formation surface 11 and the incidence plane 12 of the substrate 1 are not necessarily planar, as shown in the drawing, and may be curved.

In the present invention, the substrate 1 is not removed by etching or the like, and since the substrate 1 is detached by separating the separable layer 2 which lies between the substrate 1 and the transfer source layer 4, the operation is easily performed and the substrate 1 can be chosen from a wide range when, for example, a relatively thick substrate is used.

Next, the separable layer 2 will be described.

The separable layer 2 absorbs the light 7, which will be described below, and a separation is caused in the layer and/or at an interface 2a or 2b (hereinafter referred to as "intralayer separation" and "interfacial separation"). Preferably, by being irradiated with the light 7, interatomic or intermolecular bond strength in a material constituting the separable layer 2 disappears or decreases, that is, ablation occurs, resulting in intralayer separation and/or interfacial separation.

Moreover, by being irradiated with the light 7, a gas may be released from the separable layer 2 to affect the detachment. That is, a component contained in the separable layer 2 may be released as a gas, or the separable layer 2 is momentarily transformed into a gas by absorbing light, and the vapor is released, affecting the detachment.

As the composition of the separable layer 2, for example, following materials may be mentioned.

a) Amorphous Silicon (a-Si)

The amorphous silicon may contain H (hydrogen). In such a case, the content of H is, preferably, approximately 2 atomic % or more, and more preferably, approximately 2 to 20 atomic %. When H is contained in a predetermined amount, by the irradiation with the light 7, hydrogen is released and internal pressure is caused in the separable layer 2, which exerts a force for separating the upper and lower thin films.

The content of H in the amorphous silicon can be adjusted by appropriately setting the film-formation conditions such as the gas composition in CVD, gas pressures, gas atmospheres, gas flows, temperatures, substrate temperatures, and applied powers.

b) Oxide Ceramics such as Silicon Oxides or Silicates, Titanium Oxides or Titanates, Zirconium Oxide or Zirconates, and Lanthanum Oxide or Lanthanates, Dielectrics (Ferroelectrics), or Semiconductors.

Silicon oxides include SiO, $SiO_2$, and $Si_3O_2$, and silicates include, for example, $K_2SiO_3$, $Li_2SiO_3$, $CaSiO_3$, $ZrSiO_4$, and $Na_2SiO_3$.

Titanium oxides include TiO, $Ti_2O_3$, and $TiO_2$, and titanates include, for example, $BaTiO_4$, $BaTiO_3$, $Ba_2Ti_9O_{20}$, $BaTi_5O_{11}$, $CaTiO_3$, $SrTiO_3$, $PbTiO_3$, $MgTiO_3$, $ZrTiO_2$, $SnTiO_4$, $Al_2TiO_5$, and $FeTiO_3$.

Zirconium oxide includes $ZrO_2$, and zirconates include, for example, $BaZrO_3$, $ZrSiO_4$, $PbZrO_3$, $MgZrO_3$, and $K_2ZrO_3$.

c) Ceramics or Dielectrics (Ferroelectrics) such as PZT, PLZT, PLLZT, and PBZT d) Nitride Ceramics such as Silicon Nitride, Aluminum Nitride, and Titanium Nitride.

e) Organic Polymeric Materials

Any organic polymeric material is acceptable if it has bonds such as —$CH_2$—, —CO—(ketone), —CONH-(amido), —NH-(imido), —COO-(ester), —N=N-(azo), and —CH=N-(Schiff)(these bonds are broken by irradiation with the light 7), and in particular, if it has many of the above bonds. Alternatively, organic polymeric materials may include aromatic hydrocarbons (at least one benzene ring or fused ring thereof) in the structural formulas.

Specific examples of such organic polymeric materials include polyolefins such as polyethylene and polypropylene, polyimides, polyamides, polyesters, polymethyl methacrylate (PMMA), polyphenylene sulfide (PPS), polyether sulfone (PES), and epoxy resins.

f) Metals

Metals include, for example, Al, Li, Ti, Mn, In, Sn, Sm, or alloys which contain at least one thereof.

Although the thickness of the separable layer 2 may vary depending on the purpose of separation and conditions such as the composition of the separable layer 2, layer configurations, and formation methods, generally, the thickness of the separable layer 2 is, preferably, approximately 1 nm to 20 $\mu$m, more preferably, approximately 10 nm to 2 $\mu$m, and further more preferably, approximately 40 nm to 1 $\mu$m.

If the thickness of the separable layer 2 is too small, the uniformity of the deposition may be deteriorated, resulting in nonuniform separation. If the thickness is too large, in order to secure satisfactory separability of the separable layer 2, the power of the light 7 (luminous energy) must be increased, prolonging the time it takes to subsequently remove the separable layer 2. The thickness of the separable layer 2 is preferably as uniform as possible.

Methods for forming the separable layer 2 are not limited to specific ones and are appropriately chosen depending on conditions such as the composition of the film and the film thickness. For example, the methods include various types of vapor-phase deposition such as CVD (including MOCVD, low pressure CVD, ECR-CVD), vapor deposition, molecular beam vapor deposition (MB), sputtering, ion plating, and PVD; various types of plating such as electroplating, immersion plating (dipping), and electroless plating; coating methods such as Langmuir-Blodgett (LB) process, spin coating, spray coating, and roll coating; various printing methods; transfer methods; ink-jet methods; and powder-jet methods. It is possible to combine at least two of the above methods for formation.

For example, when the separable layer 2 is composed of amorphous silicon (a-Si), deposition by CVD, in particular, by low pressure CVD or plasma CVD, is preferable.

When the separable layer 2 is composed of ceramics formed by sol-gel processing or is composed of organic polymeric materials, deposition by coating methods, in particular, by spin coating is preferable.

The separable layer 2 may be formed in two or more steps (e.g., layer-formation step and heat-treatment step).

The separable layer 2 may be composed of at least two layers. In such a case, the composition or characteristics of the at least two layers may be the same or different.

Figure 2:
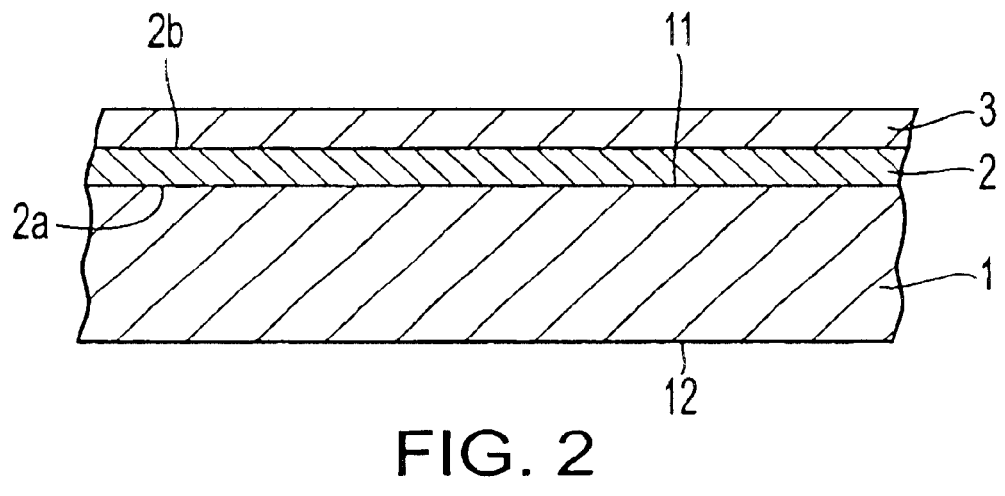
FIG. 2 is a sectional view which schematically shows steps of an example of a method for transferring a thin film configuration in the present invention.

(2) As shown in FIG. 2, an intermediate layer (underlying layer) 3 is formed on the separable layer 2.

The intermediate layer 3 is formed for various purposes, including at least one of the functions as a protective layer for physically or chemically protecting the transfer source layer 4 (which will be described below) during fabrication or in use, as an insulating layer, as a conductive layer, as a light-shielding layer for the light 7, as a barrier layer for preventing the migration of components to or from the transfer source layer 4, and as a reflective layer.

The composition of the intermediate layer 3 may be appropriately set according to the formation purposes. For example, when the intermediate layer 3 is formed between the separable layer 2 composed of amorphous silicon and the transfer source layer 4 including a thin film transistor (TFT), a silicon oxide such as $SiO_2$ may be used. When the intermediate layer 3 is formed between the separable layer 2 and the transfer source layer 4 composed of PZT, a metal such as Pt, Au, W, Ta, Mo, Al, Cr, Ti, or an alloy thereof may be used.

Although the thickness to the intermediate layer 3 is appropriately set depending on the purpose of formation or the extent to which the layer functions, generally, the thickness is, preferably, approximately 10 nm to 5 $\mu$m, and more preferably, approximately 40 nm to 1 $\mu$m.

The intermediate layer 3 may be formed by the same methods as those of the separable layer 2 described above. Additionally, the intermediate layer 3 may be formed in two or more steps.

The intermediate layer 3 may include at least two layers composed of the same material or different materials. In the present invention, instead of forming the intermediate layer 3, the transfer source layer 4 may be formed directly on the separable layer 2.

Figure 3:
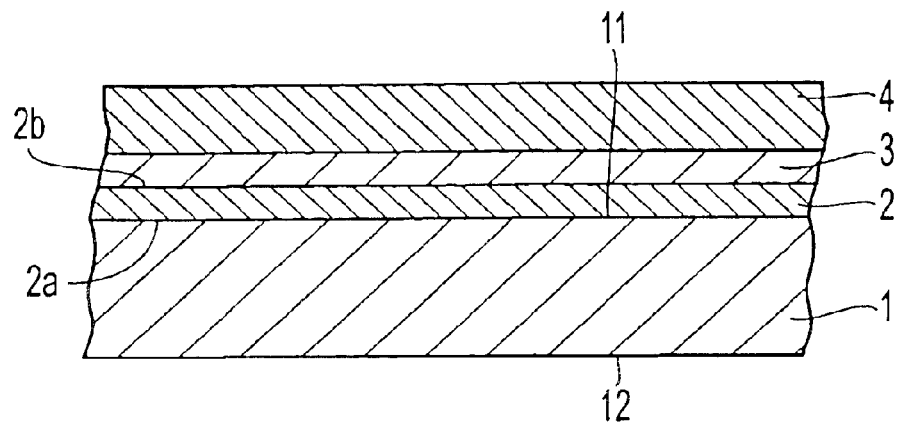
FIG. 3 is a sectional view which schematically shows steps of an example of a method for transferring a thin film configuration in the present invention.

(3) As shown in FIG. 3, the transfer source layer (material to be separated) 4 is formed on the intermediate layer 3.

The transfer source layer 4 is a layer to be transferred to a transfer destination layer 6, which will be described below, and may be formed by the same methods as those of the separable layer 2 described above.

Although there is no limitation on the purposes of formation, types, forms, configurations, compositions, physical or chemical characteristics, and the like with respect to the transfer source layer 4, the transfer source layer 4 is preferably a thin film, in particular, a functional thin film or a thin film device in view of the purpose and usefulness of the transfer.

The functional thin films and thin film devices include, for example, thin film transistors (TFTs), thin film diodes, and other semiconductor devices; electrodes (such as transparent electrodes composed of ITO or a mesa film); photoelectric conversion devices used for solar cells, image sensors, or the like; switching elements; memories; actuators such as piezoelectric elements; micro mirrors (piezo-thin film ceramics); recording media such as magnetic recording media, magneto-optical recording media, and optical recording media; magnetic recording thin film heads, coils, inductors, thin film materials having a high permeability, and micro magnetic devices formed by combining therewith; optical thin films such as filters, reflecting films, dichroic mirrors, and polarizing elements; superconducting thin films (e.g., YBCO thin films); magnetic thin films; metal multilayered films; metal-ceramic multilayered films; metal-semiconductor multilayered films; ceramic-semiconductor multilayered films; and multilayered films including organic thin films and other materials.

In particular, the application of the invention to thin film devices, micro magnetic devices, micro three-dimensional configurations, actuators, micro mirrors, etc., is useful, and thus preferable.

Such functional thin films or thin film devices are generally formed at relatively high processing temperatures. Therefore, as described above, the substrate 1 must be highly reliable so as to resist the processing temperatures.

The transfer source layer 4 may be single-layered or multilayered. Moreover, the transfer source layer 4 may be provided with predetermined patterning, such as thin film transistors or the like described above. The formation (deposition) and patterning of the transfer source layer 4 are performed in an appropriately predetermined method. Such a transfer source layer 4 is generally formed in a plurality of steps.

The formation of the transfer source layer 4 comprising a thin film transistor may be performed in accordance with the method disclosed in Japanese Examined Patent Publication No. 2-50630, or in the literature H. Ohshima et al.; International Symposium Digest of Technical Papers SID, 1983; "B/W and Color LC Video Display Addressed by Poly Si TFTs".

There is no limitation on the thickness of the transfer source layer 4, and the thickness is appropriately set depending on conditions such as the purpose of the formation, the function, the composition, and characteristics. When the transfer source layer 4 is a thin film transistor, the thickness thereof is, preferably, approximately 0.5 to 200 $\mu$m, and more preferably, approximately 1.0 to 10 $\mu$m. In the case of other thin films, the preferred total thickness may be set in a wider range, for example, at approximately 50 nm to 1,000 $\mu$m.

Additionally, the transfer source layer 4 is not limited to the thin film described above, and it may be a thick film such as a coated film or a sheet.

Figure 4:
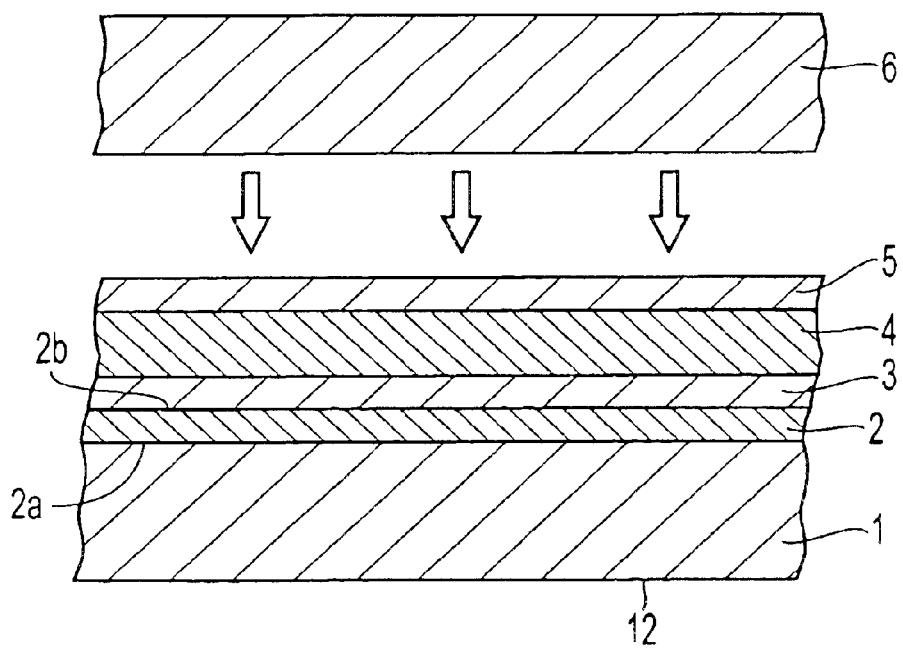
FIG. 4 is a sectional view which schematically shows steps of an example of a method for transferring a thin film configuration in the present invention.

(4) As shown in FIG. 4, an adhesive layer 5 is formed on the transfer source layer (material to be separated) 4, and the transfer destination layer 6 is bonded (joined) to the transfer source layer 4 with the adhesive layer 5 therebetween.

Preferred examples of an adhesive constituting the adhesive layer 5 include various types of setting adhesives, for example, reactive adhesives, thermosetting adhesives, photo-setting adhesives such as ultraviolet-curing adhesives, and anaerobic adhesives. The adhesive may be composed of any resin such as epoxy-based, acrylate-based, or silicone-based. Such an adhesive layer 5 is formed, for example, by a coating method.

When the setting adhesive is used, for example, after the setting adhesive is applied on the transfer source layer 4, and the transfer destination layer 6, which will be described below, is bonded thereon, the setting adhesive is cured by a curing method in accordance with the characteristics of the setting adhesive to bond and fix the transfer source layer 4 and the transfer destination layer 6 to each other.

When a photo-setting adhesive is used, after the transfer destination layer 6, which transmits light, is placed on the uncured adhesive layer 5, preferably, light for curing is radiated from above the transfer destination layer 6 to cure the adhesive. If the substrate 1 transmits light, light for curing may be emitted from both sides of the substrate 1 and the transfer destination layer 6 to cure the adhesive, which will ensure curing, and thus is preferable.

Additionally, in a manner different from that shown in the drawing, it is possible for the adhesive layer 5 to be formed on the side of the transfer destination layer 6 and for the transfer source layer 4 to be bonded thereon. An intermediate layer as described above may be provided between the transfer source layer 4 and the adhesive layer 5. When, for example, the transfer destination layer 6 itself has the function of bonding, the formation of the adhesive layer 5 may be omitted.

As the transfer destination layer 6, although not limited thereto, a substrate (plate), in particular, a transparent substrate may be used. Such a substrate may be flat or curved.

The transfer destination layer 6 may have inferior characteristics, such as heat resistance and corrosion resistance, in comparison with the substrate 1. The reason for this is that, in the present invention, since the transfer source layer 4 is formed on the side of the substrate 1 and the transfer source layer 4 is then transferred to the transfer destination layer 6, the characteristics required for the transfer destination layer 6, in particular, heat resistance, does not depend on temperature conditions, etc., during the formation of the transfer source layer 4.

Therefore, given that the maximum temperature is Tmax during the formation of the transfer source layer 4, as a component of the transfer destination layer 6, a material having a glass transition point (Tg) or a softening point of Tmax or less can be used. For example, the transfer destination layer 6 may be composed of a material having a glass transition point (Tg) or a softening point of, preferably, 800° C. or less, more preferably, 500° C. or less, and even more preferably, 320° C. or less.

Although the transfer destination layer 6 preferably has rigidity (strength) to a certain extent as a mechanical characteristic, it may have flexibility or elasticity.

As a component of such a transfer destination layer 6, various synthetic resins or various types of glass materials are used, and in particular, various synthetic resins or general (having a low melting point) inexpensive glass materials are preferred.

As synthetic resins, either thermoplastic resins or thermosetting resins may be used. Examples include polyolefins such as polyethylene, polypropylene, ethylene-propylene copolymers, and ethylene-vinyl acetate copolymers (EVA); cyclic polyolefins; modified polyolefins; polyvinyl chloride; polyvinylidene chloride; polystyrenes; polyamides; polyimides; polyamide-imides; polycarbonate; poly-(4-methylpentene-1); ionomers; acrylic resins; poly methyl methacrylate (PMMA); acrylonitrile-butadiene-styrene copolymers (ABS resins); acrylonitrile-styrene copolymers (AS resins); butadiene-styrene copolymers; polyoxymethylene; polyvinyl alcohol (PVA); ethylene-vinyl alcohol copolymers (EVOH); polyesters such as polyethylene terephthalate (PET), polybutylene terephthalate (PBT), and polycyclohexane terephthalate (PCT); polyethers; polyether ketone (PEK); polyether ether ketone (PEEK); polyether imides; polyacetal (POM); polyphenylene oxide; modified polyphenylene oxide; polysulfones; polyphenylene sulfide (PPS); polyether sulfone (PES); polyarylate; aromatic polyesters (liquid crystal polymers); polytetrafluoroethylene; polyvinylidene fluoride; other fluorine-based resins; various types of thermoplastic elastomers such as styrene-based, polyolefin-based, polyvinyl chloride-based, polyurethane-based, polyester-based, polyamide-based, polybutadiene-based, trans-polyisoprene-based, fluoro rubber-based, and chlorinated polyethylene-based; epoxy resins; phenolic resins; urea resins; melamine resins; unsaturated polyesters; silicone resins; polyurethanes; or copolymers, blends, and polymer alloys mainly composed of the compounds described above. By using one of the above materials or by combining at least two of the above materials, the transfer destination layer 6 may be formed, (for example, as a multilayered film including at least two layers).

As glass materials, for example, silicate glass (quartz glass), silicate alkali glass, soda-lime glass, potassium-lime glass, lead (alkali) glass, barium glass, and borosilicate glass may be used. The above materials, excluding silicate glass, have a low melting point in comparison with silicate glass and are relatively readily formable and processable, and moreover are inexpensive, and thus are preferable.

When the transfer destination layer 6 composed of a synthetic resin is used, there are various advantages. For example, a large transfer destination layer 6 can be formed integrally and even if a transfer destination layer 6 has a complex shape such as curved surfaces or unevenness, the fabrication is easy, and the material cost and the fabrication cost are low. Thus, large and inexpensive devices (e.g., liquid crystal displays) can be easily fabricated.

Additionally, the transfer destination layer 6 may be an independent device such as a liquid crystal cell, or may be a component constituting a device, such as a color filter, an electrode layer, a dielectric layer, an insulating layer, or a semiconductor device.

Further, the transfer destination layer 6 may be composed of a metal, a ceramic, stone, wood, paper, or the like, and may be placed on a given surface constituting an article (such as on the surface of a clock, on the surface of an air conditioner, or on the surface of a printed board), and further on the surface of a structure such as a wall, a pillar, a beam, a ceiling, or a windowpane.

Figure 5:
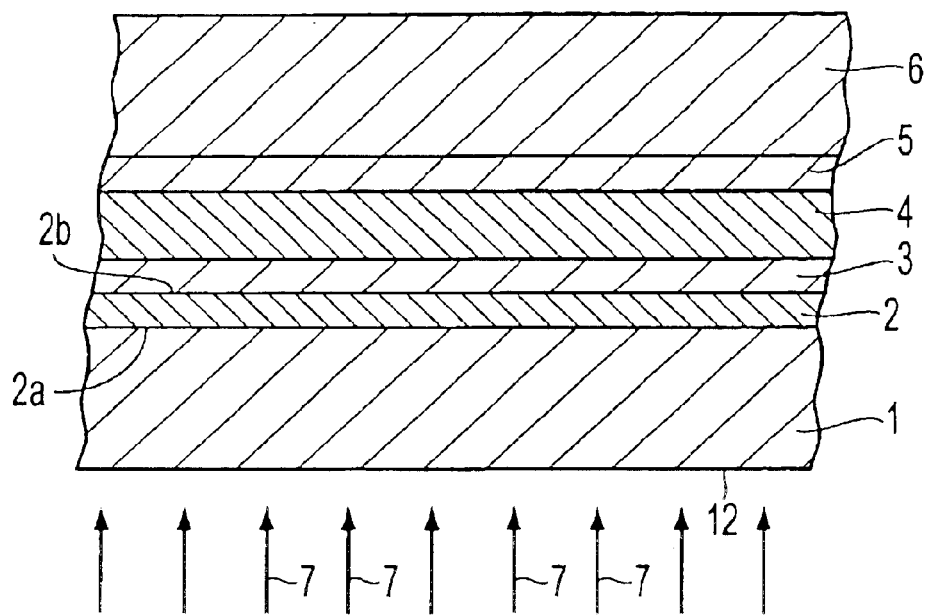
FIG. 5 is a sectional view which schematically shows steps of an example of a method for transferring a thin film configuration in the present invention.
Figure 6:
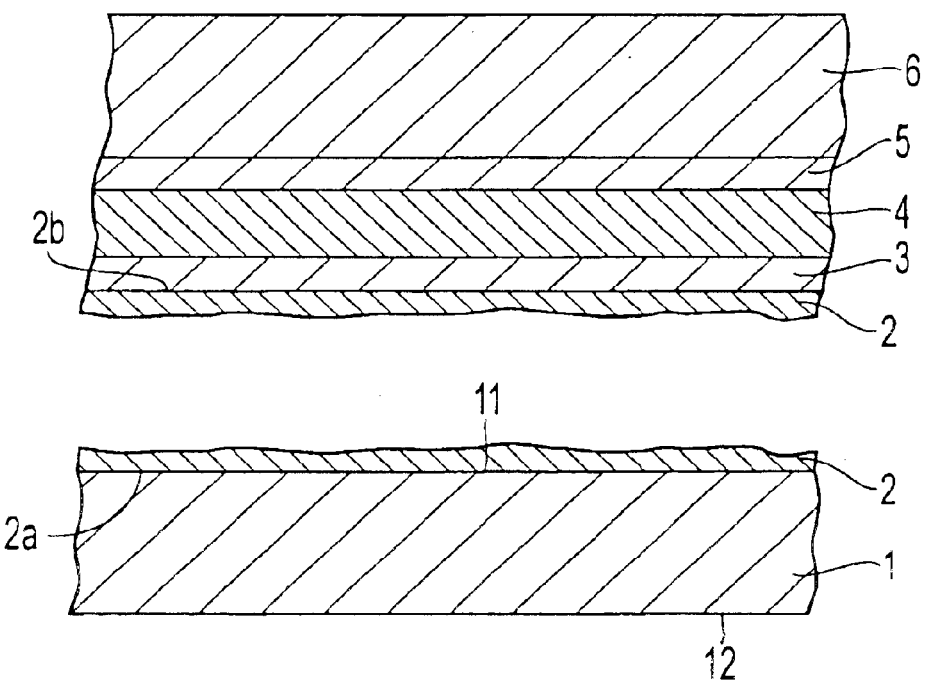
FIG. 6 is a sectional view which schematically shows steps of an example of a method for transferring a thin film configuration in the present invention.
Figure 7:
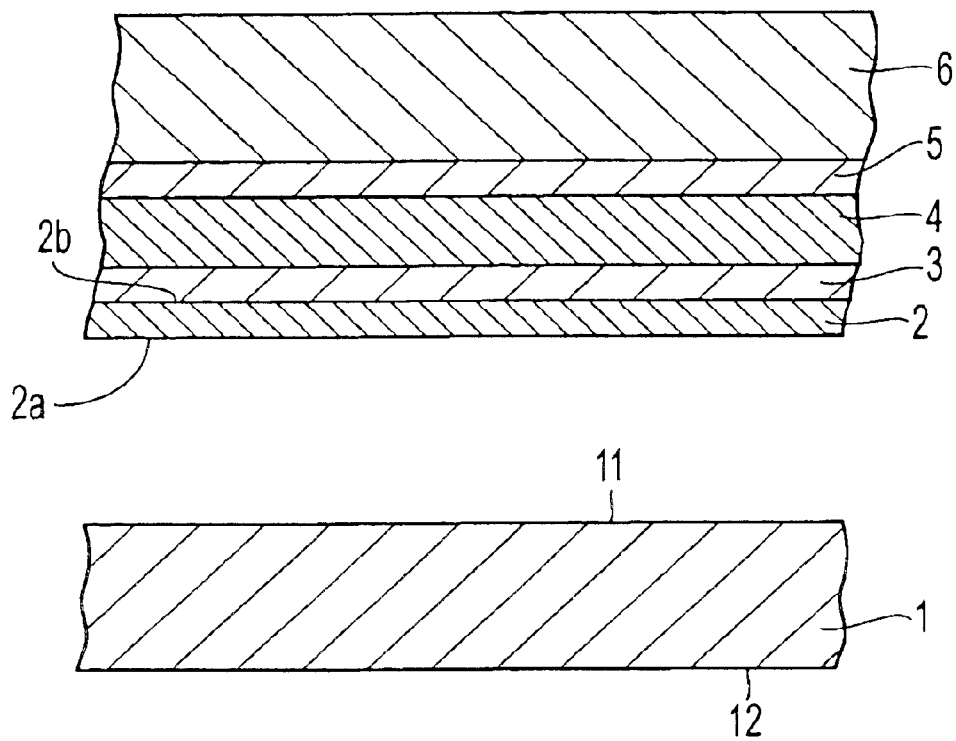
FIG. 7 is a sectional view which schematically shows steps of an example of a method for transferring a thin film configuration in the present invention.

(5) As shown in FIG. 5, the back surface (incidence plane 12) of the substrate 1 is irradiated with the light 7. The light 7 passes through the substrate 1 and then enters into the separable layer 2 from the side of the interface 2a. As a result, as shown in FIG. 6 or FIG. 7, an intralayer separation and/or an interfacial separation is caused in the separable layer 2, and bond strength decreases or disappears. Thus, if the substrate 1 is pulled apart from the transfer destination layer 6, the transfer source layer 4 is detached from the substrate 1 and is transferred to the transfer destination layer 6.

FIG. 6 shows a case in which an intralayer separation is caused in the separable layer 2, and FIG. 7 shows a case in which an interfacial separation is caused at the interface 2a in the separable layer 2. The occurrence of the intralayer separation and/or the interfacial separation is presumably due to ablation that occurs in the materials constituting the separable layer 2, and that a gas contained in the separable layer 2 is evolved. Further, a phase change such as fusion or transpiration occurs immediately after the irradiation.

Herein, "ablation" means that a solid material (a component of the separable layer 2), which has absorbed light, is photochemically or thermally excited, and interatomic or intermolecular bonds on the surface or in the interior of the separable layer 2 are broken and evolved. The ablation mainly occurs as a phenomenon in which a phase change such as fusion, transpiration (vaporization), or the like occurs entirely or partially in the component of the separable layer 2. Additionally, the phase change may cause a micro foaming state, resulting in a decrease in bond strength.

Whether intralayer separation occurs, interfacial separation occurs, or both occur in the separable layer 2 depends on the composition of the separable layer 2 or on various other factors. One of the factors includes the characteristics of the light 7 such as type, wavelength, intensity, and depth of penetration.

The light 7 may be any light which causes intralayer separation and/or interfacial separation in the separable layer 2. For example, X-rays, ultraviolet radiation, visible radiation, infrared radiation (thermal waves), a laser beam, millimeter wave, microwaves, an electron beam, or radiation ($\alpha$-rays, $\beta$-rays, and $\gamma$-rays) may be used. Among these, a laser beam is preferred because it readily causes the separation (ablation) of the separable layer 2.

As a laser for generating the laser beam, various types of gas lasers and solid-state lasers (semiconductor lasers) may be used. However, an excimer laser, an Nd-YAG laser, an Ar laser, a $CO_2$ laser, a CO laser, an He—Ne laser, or the like is preferably used, and among them, an excimer laser is particularly preferable.

Since the excimer laser generates high energy in the short wavelength range, it can cause ablation in the separable layer in a very short time. Therefore, the separable layer 2 can be separated without greatly raising the temperatures of the adjacent or nearby layers such as the intermediate layer 3, the transfer source layer 4, and the substrate 1, that is, without degradation or damage.

When light for causing ablation in the separable layer 2 has wavelength dependence, the laser radiation preferably has a wavelength of approximately 100 to 350 nm.

When separation characteristics are imparted to the separable layer 2 by a phase change such as gas evolution, vaporization, or sublimation, the laser radiation preferably has a wavelength of approximately 350 to 1,200 nm.

The energy density of the laser radiation, in particular, the energy density in the case of an excimer laser, is set, preferably, at approximately 10 to 5,000 $mJ/cm^2$, and more preferably at approximately 100 to 500 $mJ/cm^2$. The irradiation period is set, preferably at approximately 1 to 1,000 nsec, and more preferably at 10 to 100 nsec.

If the energy density is low or the irradiation period is short, sufficient ablation or the like does not occur, and if the energy density is high or irradiation period is long, the light which passed through the separable layer 2 and the intermediate layer 3 may adversely affect the transfer source layer 4.

The light 7 represented by such a laser beam is preferably emitted so that the intensity thereof is made uniform.

The irradiation direction of the light 7 is not limited to being perpendicular to the separable layer 2, and it may be inclined by a predetermined number of degrees in relation to the separable layer 2.

When the area of the separable layer 2 is larger than the area irradiated by a single exposure of light, the entire separable layer 2 may be irradiated with a plurality of exposures of light. Two or more exposures of light to the same spot may be acceptable.

Additionally, two or more exposures of light (laser beams) of different types and of different wavelengths (wavelength ranges) may be applied to the same region or to different regions.

Figure 8:
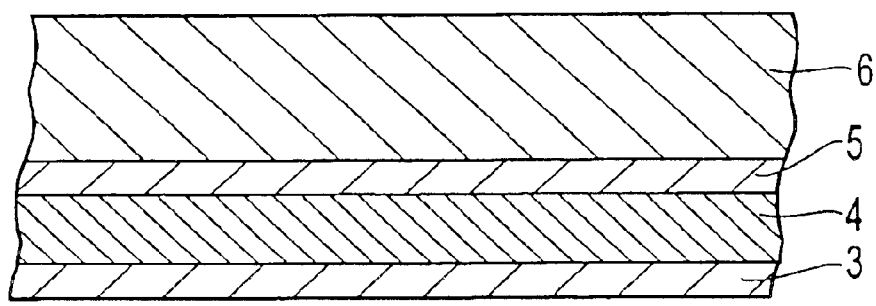
FIG. 8 is a sectional view which schematically shows steps of an example of a method for transferring a thin film configuration in the present invention.

(6) As shown in FIG. 8, the separable layer 2 attached to the intermediate layer 3 is removed by cleaning, etching, ashing, grinding, or the like, or by a combination thereof.

In the case of an intralayer separation as shown in FIG. 6, the separable layer 2 attached to the substrate 1 is also removed in the same way.

Additionally, when the substrate 1 is composed of an expensive material such as quartz glass or a rare material, the substrate 1 will preferably be reused (recycled). That is, since the present invention is applicable to the substrate 1 which is desired to be reused, the utility of the invention is high.

After the steps described above have been followed, the transfer of the transfer source layer 4 to the transfer destination layer 6 is completed. Then, the intermediate layer 3 adjacent to the transfer source layer 4 may be removed, or any other layer may be formed.

In the present invention, the transfer source layer 4 itself, which is to be separated, is not directly detached, but the separation is performed in the separable layer 2 joined to the transfer source layer 4. Thus, the separation (transfer) can be performed easily, securely, and uniformly regardless of characteristics, conditions, etc. of the object to be separated (transfer source layer 4). There is no damage to the object to be separated (transfer source layer 4) due to the separation operation, and high reliability of the transfer source layer 4 can be maintained.

Although, in the example shown in the drawing, the light 7 is irradiated to the side of the substrate 1, for example, when the transfer source layer 4 is not adversely affected by the radiation of the light 7, the radiation direction of the light 7 is not limited to the above, and the light 7 may be irradiated from the opposite side to the substrate 1.

It is possible that the light is radiated selectively in the planar direction of the separable layer 2, that is, in a predetermined pattern, and the transfer source layer 4 is transferred in the predetermined pattern (first method). In such a case, with respect to the step described in (5), the incidence plane 12 of the substrate 1 may be applied with a masking corresponding to the pattern before the radiation of the light 7, or the radiation position of the light 7 may be precisely controlled.

The separable layer 2 may be formed on the separable layer-formation surface 11 of the substrate 1 in a predetermined pattern instead of on the entire surface (second method). In such a case, the separable layer 2 may be formed preliminarily in a predetermined pattern using a masking or the like. Alternatively, the separable layer 2 formed on the entire separable layer-formation surface 11 may be patterned or trimmed by etching or the like.

In accordance with the first and second methods, the transfer of the transfer source layer 4 can be performed simultaneously with the patterning or the trimming.

The transfer may be repeated more than twice in the same manner as that described above. In such a case, if the number of the transfer is even, the front-back positional relation of the transfer source layer formed on the last transfer destination layer can be set in the same state as that when the transfer source layer is first formed on the substrate 1.

It is possible that with a large transparent substrate (e.g., effective area: 900 mm×1,600 mm) being selected as the transfer destination layer 6, a small unit of a transfer source layer 4 (thin film transistor) formed on a small substrate 1 (e.g., effective area: 45 mm×40 mm) is transferred sequentially a plurality of times (for example, approximately 800 times), preferably, to the adjacent position, to transfer the transfer source layer 4 to the entire effective area of the large transparent substrate, and finally a liquid crystal display is fabricated in the same size as that of the large transparent substrate.

By preparing a plurality of transfer source layers 4 formed on the substrate 1, the individual transfer source layers 4 may be transferred (superposed) sequentially on the transfer destination layer 6 to form a multilayered structure of the transfer source layers 4. In such a case, the transfer source layers 4 to be deposited may be the same or may be different.

What has been described above is the method for transferring a thin film configuration used in the present invention.

Next, a first example of a three-dimensional device (multilayered device) of the present invention using the method for transferring a thin film configuration (transfer technique) described above and a fabrication method thereof will be described.

Figure 9:
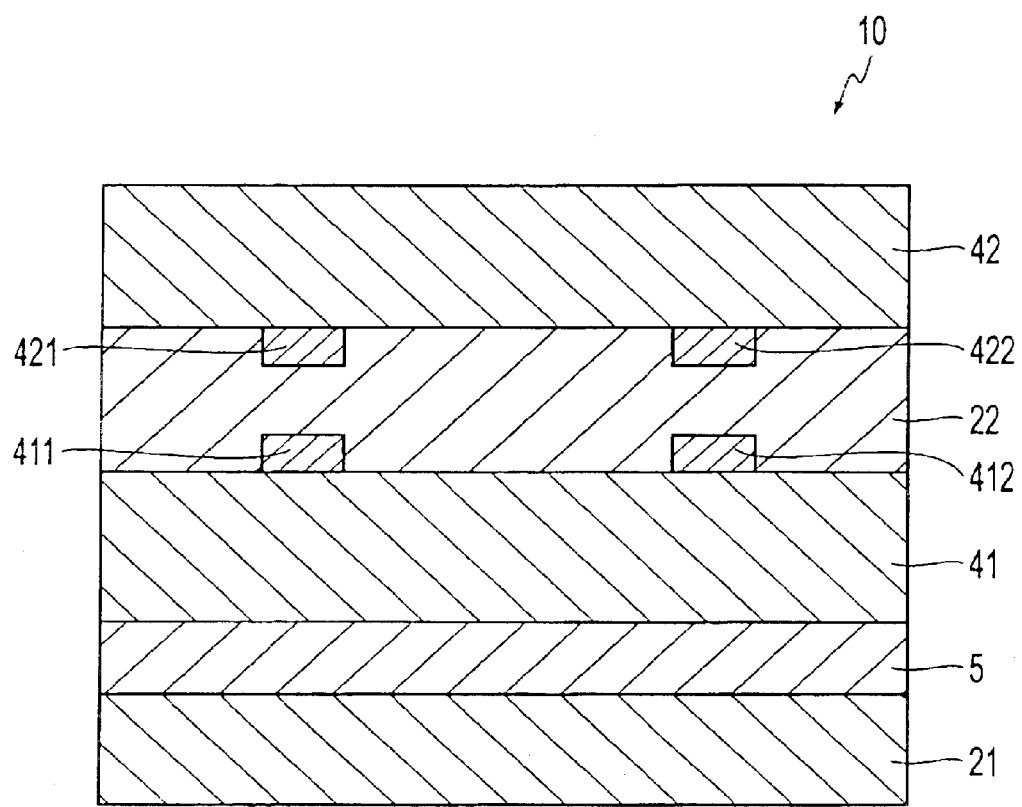
FIG. 9 is a sectional view which schematically shows a first example of a three-dimensional device in the present invention.

FIG. 9 is a sectional view which schematically shows the first example of a three-dimensional device in the present invention. FIGS. 10 to 15 are sectional views which schematically show steps for fabricating the three-dimensional device shown in FIG. 9. Descriptions of aspects common with the method for transferring a thin film configuration described above will be omitted.

As shown in FIG. 9, a three-dimensional device 10 includes a substrate (substrate on the transfer destination side) 21 as a base, a first transfer source layer (first thin film device layer) 41, and a second transfer source layer (second thin film device layer) 42. Each of the transfer source layers 41 and 42 extends in the planar direction (parallel to the substrate 21) and constitutes a predetermined circuit.

To the upper end of the substrate 21 in FIG. 9, the transfer source layer 41 is bonded (joined) with an adhesive layer 5 therebetween.

To the upper end of the transfer source layer 41 in FIG. 9, the transfer source layer 42 is bonded (joined) with a conductive adhesive layer 22 therebetween.

The transfer source layer 41 is provided with connecting electrodes (terminals for connection) 411 and 412 on the upper end in FIG. 9. The transfer source layer 41 is provided with connecting electrodes 421 and 422 on the lower end in FIG. 9. The connecting electrode 411 of the transfer source layer 41 and the connecting electrode 421 of the transfer source layer 42 are electrically connected to each other with the conductive adhesive layer 22 therebetween. The connecting electrode 412 of the transfer source layer 41 and the connecting electrode 422 of the transfer source layer 42 are electrically connected to each other with the conductive adhesive layer 22 therebetween.

As the conductive adhesive layer 22, an anisotropic conductive film (ACF) is preferably used. By bonding with the anisotropic conductive film, conduction is secured in the thickness direction (perpendicularly in FIG. 9) alone, and thus, a horizontal short circuit in FIG. 9 can be prevented. That is, short-circuiting between the connecting electrode 411 and the connecting electrode 412, between the connecting electrode 411 and the connecting electrode 422, between the connecting electrode 421 and the connecting electrode 422, and between the connecting electrode 421 and the connecting electrode 412 can be prevented.

By bonding with the anisotropic conductive film, the transfer source layer 41 and the transfer source layer 42 can be bonded coined) to each other while easily positioning the connecting electrodes so that the connecting electrode 411 and the connecting electrode 421, and the connecting electrode 412 and the connecting electrode 422, are electrically connected to each other, respectively.

The substrate (substrate on the transfer destination side) 21 of the three-dimensional device 10 corresponds to the transfer destination layer 6 shown in FIGS. 4 to 8.

The various materials exemplified for the transfer source layer 4 may be used for the transfer source layers 41 and 42 of the three-dimensional device 10, for example.

Specifically, the transfer source layers 41 and 42 may be memories or memory cell arrays such as DRAM (dynamic RAM), SRAM (static RAM), $E^2$PROM, and ROM, logic circuits such as CPU, or sensors such as optical sensors and magnetic sensors, although they are not limited thereto.

The transfer source layer 41 and the transfer source layer 42 may be the same or may be different.

When the transfer source layer 41 and the transfer source layer 42 are the same, for example, both the transfer source layer 41 and the transfer source layer 42 may be set as memories or memory cell arrays. Thus, a memory with a large amount of capacity (large-scale memory) can be obtained.

Additionally, both the transfer source layer 41 and the transfer source layer 42 may be set as logic circuits. Thus, a logic circuit having a large scale (large-scale logic circuit) can be obtained.

When the transfer source layer 41 and the transfer source layer 42 are different, for example, one of the transfer source layer 41 and the transfer source layer 42 may be set as a memory or a memory cell array, and the other may be set as a logic circuit. That is, the three-dimensional device 10 will become a system IC (e.g., system LSI) in which a memory and a logic circuit are combined (integrated).

In such a case, in accordance with the present invention, the transfer source layer 41 and the transfer source layer 42 can be formed with different design rules (minimum line width). The transfer source layer 41 and the transfer source layer 42 can be formed by different design parameters. The transfer source layer 41 and the transfer source layer 42 can be formed with different fabricating processes. Conventionally, it has been impossible or difficult to change such conditions in layers deposited.

The minimum line width of memories or memory cell arrays in the system IC is set, for example, at approximately 0.35 $\mu$m ($\mu$m rule), and the minimum width of logic circuits is set, for example, at 0.5 $\mu$m ($\mu$m rule), (in which the minimum line width of memories or memory cell arrays is smaller than that of the logic circuits). On the contrary, the minimum line width of memories or memory cell arrays may be set larger than that of the logic circuits.

The three-dimensional device 10 is fabricated by the method for transferring a thin film configuration described above, for example, in a manner described below.

Figure 10B:
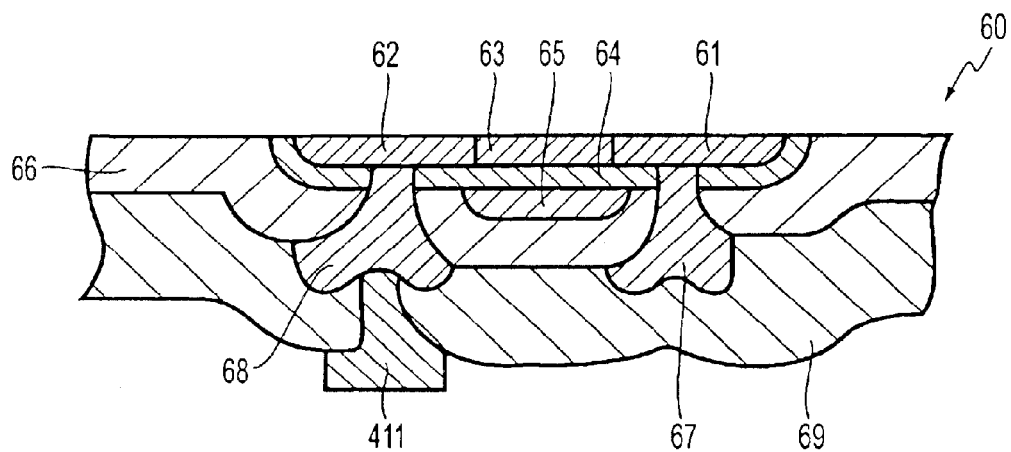
FIGS. 10A–B are sectional views which schematically show steps for fabricating the three-dimensional device shown in FIG. 9.
Figure 10A:
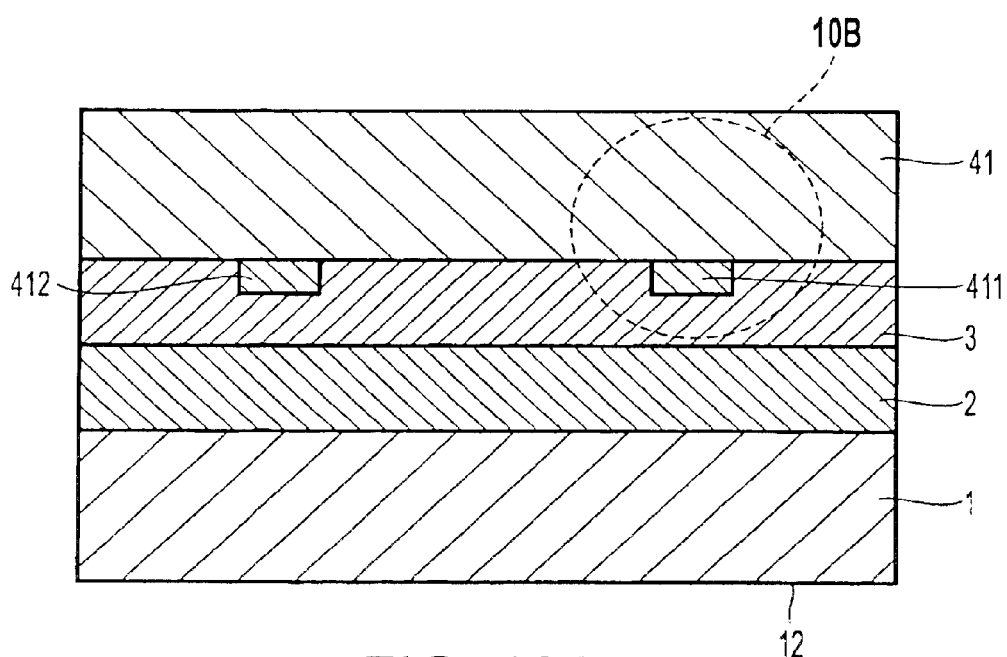
Figure 11B:
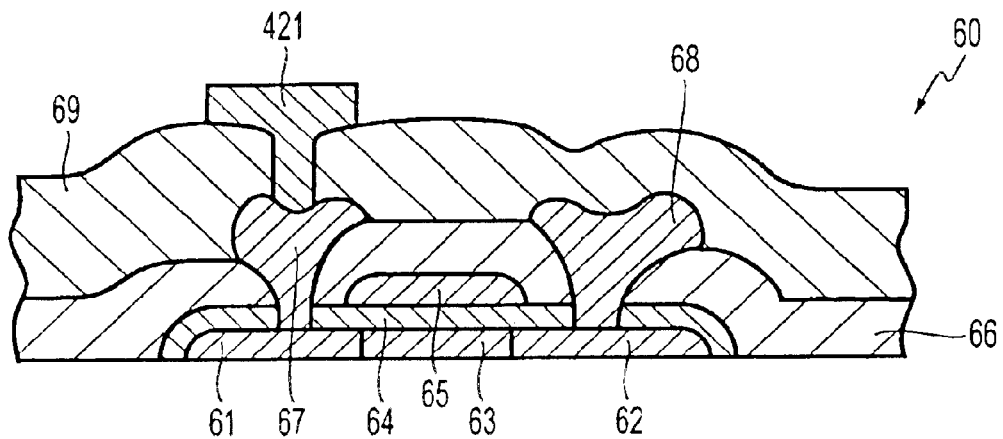
FIGS. 11A–B are sectional views which schematically show steps for fabricating the three-dimensional device shown in FIG. 9.
Figure 11A:
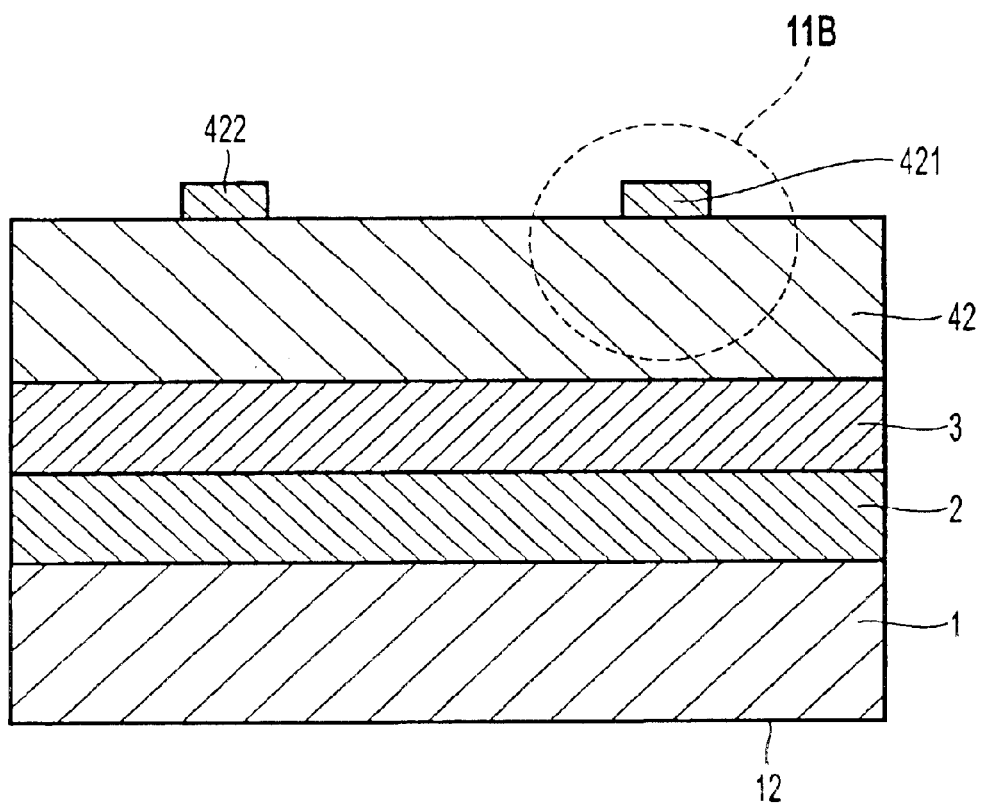

<A1> As shown in FIG. 10, a separable layer 2 is formed on a surface of a substrate (support substrate), and as shown in FIG. 11, a separable layer 2 is formed on a surface of a substrate (support substrate).

<A2> As shown in FIGS. 10 and 11, on the separable layer 2 of each substrate 1, an intermediate layer (underlying layer) 3 is formed.

<A3> As shown in FIG. 10, on the intermediate layer 3, a first transfer source layer (first thin film device layer) 41 is formed. As shown in FIG. 11, on the intermediate layer 3, a second transfer source layer (second thin film device layer) 42 is formed.

An enlarged sectional view of a section K in the transfer source layer 41 (a section surrounded by a dotted-chain line in FIG. 10) is shown in FIG. 10.

As shown in FIG. 10, the transfer source layer 41 includes, for example, a thin film transistor (TFT) 60 formed on the intermediate layer 3 (e.g., an $SiO_2$ film).

The thin film transistor 60 includes a source layer (n⁺ or p⁺ layer) 61 and a drain layer (n⁺ or p⁺ layer) 62 which have been formed by doping n-type or p-type impurities to a polysilicon layer, a channel layer 63, a gate insulating film 64, a gate electrode 65, an insulating interlayer film 66, electrodes 67 and 68 composed of, for example, aluminum, and a protective film 69.

A connecting electrode 411 is formed on the lower end of the protective film 69 of the thin film transistor 60 in FIG. 10. The connecting electrode 411 is electrically connected to the electrode 68 through a contact hole formed in the protective film 69.

An enlarged sectional view of a section K in the transfer source layer 42 (a section surrounded by a dotted-chain line in FIG. 11) is shown in FIG. 11.

As shown in FIG. 11, the transfer source layer 42 includes, for example, a thin film transistor (TFT) 60 formed on the intermediate layer 3 (e.g., an $SiO_2$ film).

The thin film transistor 60 includes a source layer (n⁺ or p⁺ layer) 61 and a drain layer (n⁺ or p⁺ layer) 62 which have been formed by doping n-type or p-type impurities to a polysilicon layer, a channel layer 63, a gate insulating film 64, a gate electrode 65, an interlayer insulating film 66, electrodes 67 and 68 composed of, for example, aluminum, and a protective film 69.

A connecting electrode 421 is formed on the upper end of the protective film 69 of the thin film transistor 60 in FIG. 11. The connecting electrode 421 is electrically connected to the electrode 67 through a contact hole formed in the protective film 69.

Since the configurations of the transfer source layer 41 near the electrode 412 and the transfer source layer 42 near the electrode 422 are substantially the same as those described above, the description thereof will be omitted.

In the present invention, a large number of transfer source layers 41 may be simultaneously formed on a substrate, e.g., a glass substrate, (not shown in the drawing) so that they may be cut out. Similarly, a large number of transfer source layers 42 may be formed simultaneously on a substrate, e.g., a glass substrate, (not shown in the drawing) so that they may be cut out.

In such a case, for example, an electrical characteristic inspection for the transfer source layers 41 and 42 is performed by bringing a probe into contact with the connecting electrodes of the transfer source layers 41 and 42 and terminals (not shown in the drawing) with each substrate provided with the transfer source layer 41 or 42 being set in a probe apparatus. Transfer source layers 41 and 42 which have been judged as being defective are marked with an inker, a scratch needle, or the like.

The transfer source layers 41 and 42 are then diced into pieces. At this stage, based on the marking, nonconforming transfer source layers 41 and 42 are sorted out from confirming transfer source layers 41 and 42. The electrical characteristic inspection for the transfer source layers 41 and 42 may be performed after dicing.

In the present invention, the transfer source layer 41 and the transfer source layer 42 may be formed simultaneously, and in particular, may be formed simultaneously on the same substrate (support substrate) 1. Thus, the number of steps can be reduced.

Figure 12:
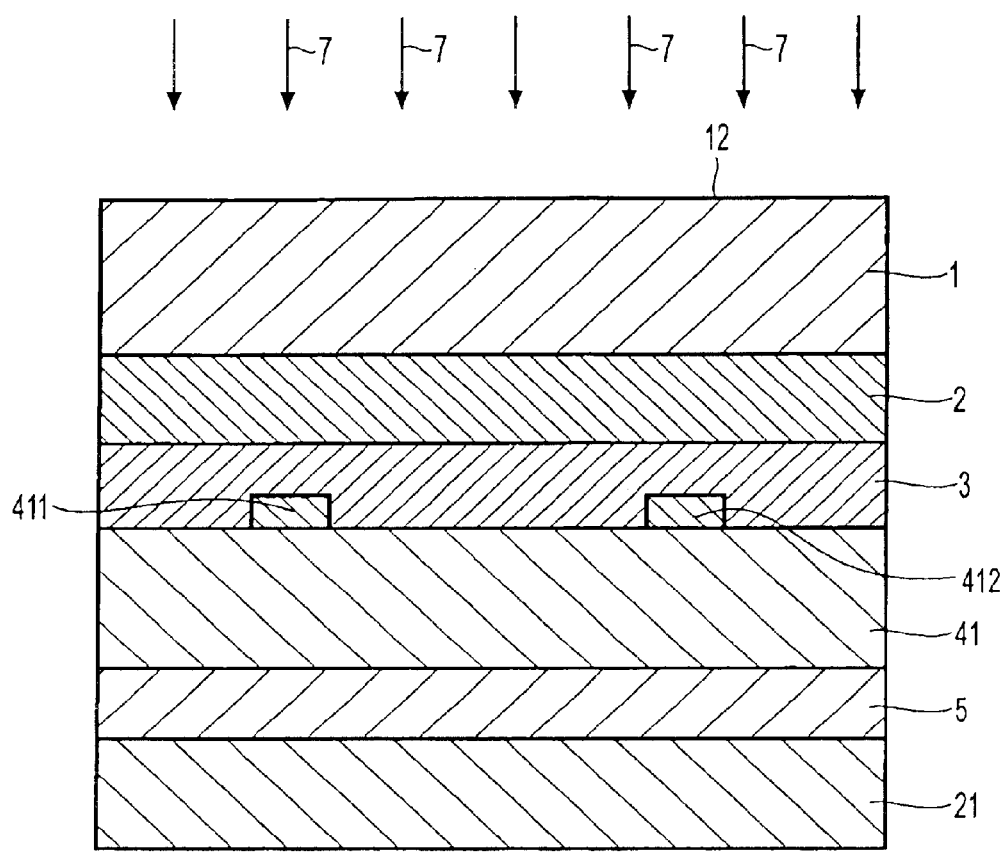
FIG. 12 is a sectional view which schematically shows steps for fabricating the three-dimensional device shown in FIG. 9.

<A4> As shown in FIG. 12, the transfer source layer 41 formed on the substrate 1 and a substrate (substrate on the transfer destination side) 21 are bonded coined) to each other with an adhesive layer therebetween.

<A5> As shown in FIG. 12, light 7 is irradiated on the back surface (incidence plane 12) of the substrate 1. As described above, the light 7 passes through the substrate 1 and then enters into the separable layer 2. Thus, intralayer separation and/or interfacial separation is produced in the separable layer 2, and bond strength decreases or disappears.

The substrate 1 and the substrate 21 are separated from each other. Thus, as shown in FIG. 13, the transfer source layer 41 is detached from the substrate 1 and is transferred to the substrate 21.

Figure 13:
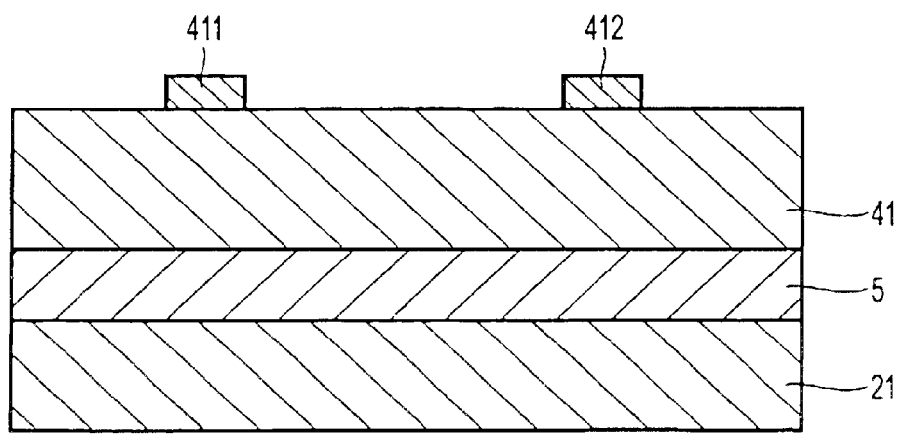
FIG. 13 is a sectional view which schematically shows steps for fabricating the three-dimensional device shown in FIG. 9.

<A6> As shown in FIG. 13, the intermediate layer 3 and the separable layer 2 on the transfer source layer 41 are removed by cleaning, etching, ashing, grinding, or the like, or by a combination thereof. As required, the intermediate layer 3 may be allowed to remain to such an extent that the connecting electrodes 411 and 412 are exposed.

When intralayer separation occurs in the separable layer 2, the separable layer 2 attached to the substrate 1 is also removed.

Additionally, when the substrate 1 is composed of an expensive material such as quartz glass or of a rare material, the substrate 1 will preferably be reused (recycled). That is, since the present invention is applicable to the substrate 1 which is desired to be reused, the utility of the invention is high.

After the steps described above have been followed, the transfer of the transfer source layer 41 to the substrate 21 is completed. Subsequently, any other specific layer may be formed.

Figure 14:
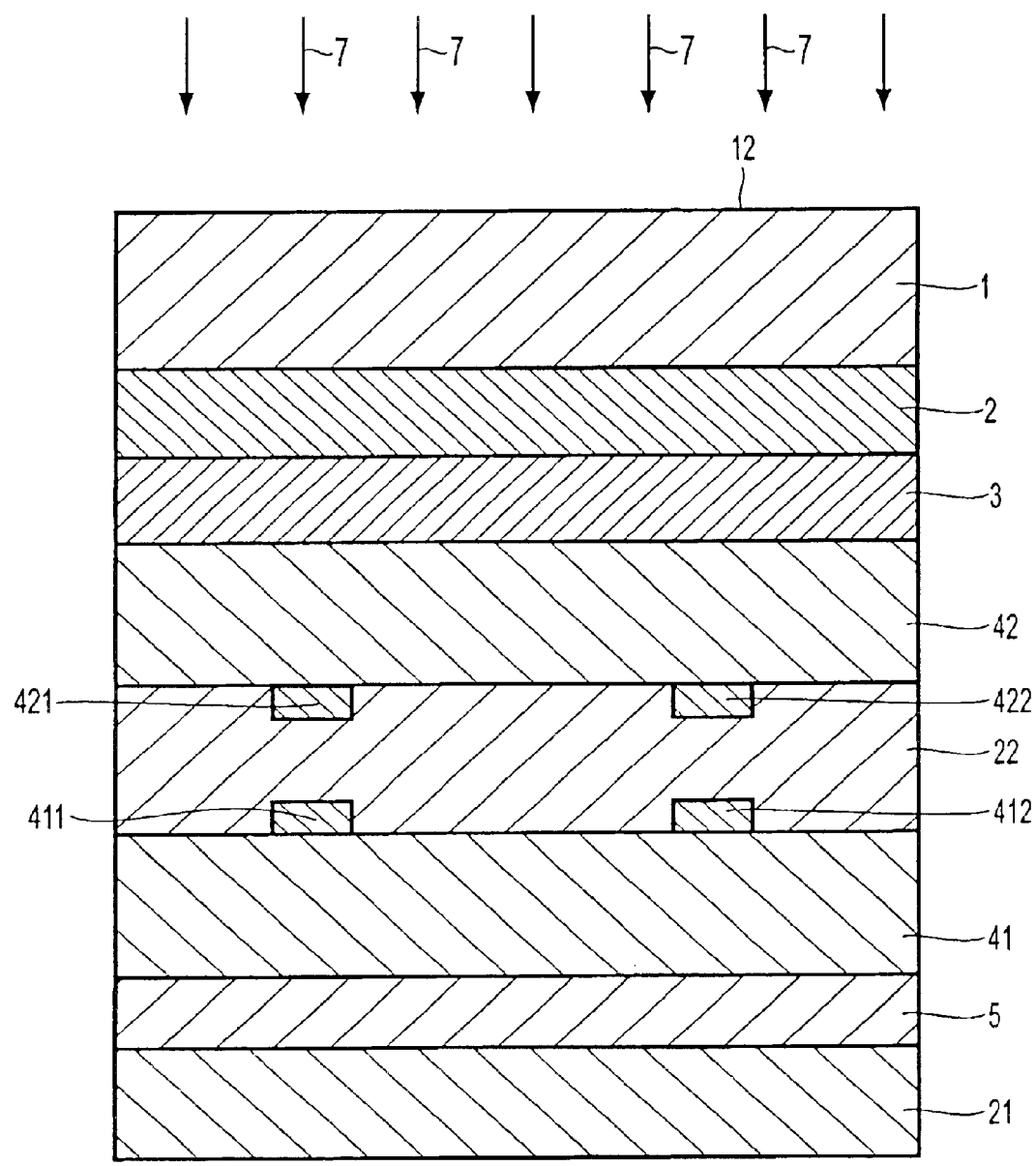
FIG. 14 is a sectional view which schematically shows steps for fabricating the three-dimensional device shown in FIG. 9.

<A7> As shown in FIG. 14, while connecting electrodes are positioned so that corresponding connecting electrodes are opposed to each other, that is, the connecting electrode 411 is opposed to the connecting electrode 421 and the connecting electrode 412 is opposed to the connecting electrode 422, the transfer source layer 42 formed on the substrate 1 and the transfer source layer 41 transferred to the substrate 21 are bonded (joined) to each other with a conductive adhesive layer 22 therebetween.

As the conductive adhesive layer 22, as described above, although an anisotropic conductive film is preferable, in the present invention, it is not limited thereto.

When bonding is performed with an anisotropic conductive film, a predetermined anisotropic conductive adhesive is filled (disposed) between the transfer source layer 41 and the transfer source layer 42, and the conductive adhesive is cured while being pressurized in the longitudinal direction in FIG. 14. Thus, the transfer source layer 41 and the transfer source layer 42 are bonded to each other with the conductive adhesive layer 22 therebetween, and conductive particles (not shown in the drawing) are connected to each other (brought into contact with each other) in the longitudinal direction in FIG. 14. Thus, the connecting electrode 411 and the connecting electrode 421, and the connecting electrode 412 and the connecting electrode 422, are electrically connected with each other with the conductive particles therebetween.

<A8> As shown in FIG. 14, light 7 is irradiated to the back surface (incidence plane 12) of the substrate 1. As described above, the light 7 passes through the substrate 1 and enters into the separable layer 2, and thus an intralayer separation and/or an interfacial separation is caused in the separable layer 2, and bond strength is decreased or eliminated.

The substrate 1 is then separated from the substrate 21. Thus, as shown in FIG. 15, the transfer source layer 42 is detached from the substrate 1 and is transferred to the transfer source layer 41.

Figure 15A:
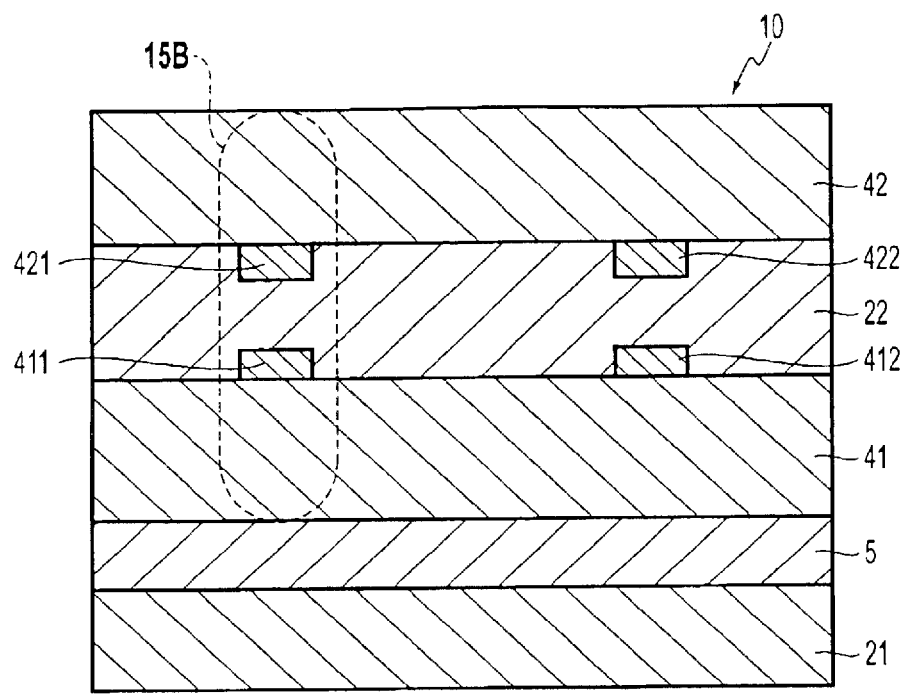
FIGS. 15A–B are sectional views which schematically show steps for fabricating the three-dimensional device shown in FIG. 9.
Figure 15B:
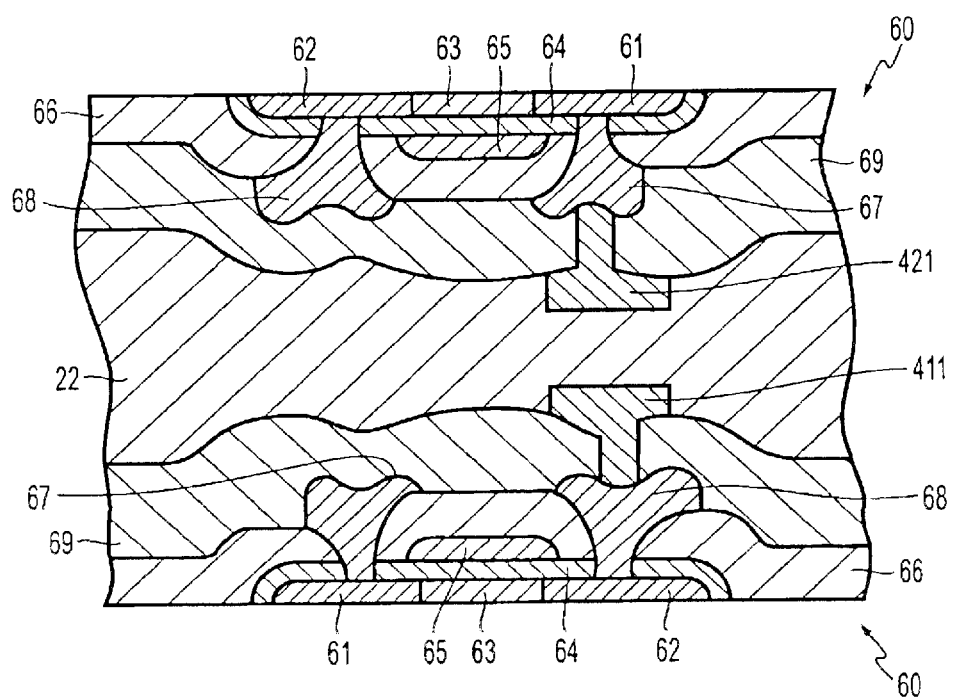

An enlarged sectional view of a section K (a section surrounded by a dotted-chain line in FIG. 15) in the transfer source layers 41 and 42 and the conductive adhesive layer 22 is shown in FIG. 15.

<A9> As shown in FIG. 15, the intermediate layer 3 and the separable layer 2 on the transfer source layer 42 are removed, for example, by cleaning, etching, ashing, or grinding, or by a combination thereof. As required, the intermediate layer 3 may be allowed to remain.

In the case of an intralayer separation of the separable layer 2, the separable layer 2 attached to the substrate 1 is also removed in a similar manner.

Additionally, when the substrate 1 is composed of an expensive material such as quartz glass or of a rare material, the substrate 1 will preferably be reused (recycled). That is, since the present invention is applicable to the substrate 1 which is desired to be reused, the utility of the invention is high.

After the steps described above have been followed, the transfer of the transfer source layer 42 to the transfer source layer 41, that is, the deposition of the transfer source layer 42 on the transfer source layer 41, is completed. Subsequently, any other specific layer may be formed.

As described above, since the three-dimensional device 10 in the present invention is formed by depositing thin film device layers by transferring (a transfer method), the three-dimensional device (e.g., three-dimensional IC) can be fabricated easily.

In particular, since each of the thin film device layers can be fabricated individually, there is no need to take into consideration potential adverse effects on lower layers (thin film device layers on the lower side) as in conventional devices, and fabrication conditions are flexible.

In the three-dimensional device 10 in the present invention, since a plurality of thin film device layers are deposited, integration versatility can be improved. That is, an IC (e.g., LSI) or the like can be fabricated on a relatively small area even with relatively easy design rules.

For example, when the three-dimensional device 10 has a memory (e.g., both of the transfer source layers 41 and 42 are memories), the capacity of the memory can be increased. When the three-dimensional device 10 has a logic circuit (e.g., both of the transfer source layers 41 and 42 are logic circuits), the scale of the logic circuit can be increased.

In the present invention, since the individual thin film device layers can be formed on different substrates at first, the individual thin film device layers can be formed with specific device parameters (for example, gate-line width, thickness of a gate insulating film, design rules, and fabrication conditions such as temperature during fabrication). Therefore, the individual thin film device layers can be fabricated with optimal device parameters, and thus, a highly reliable three-dimensional device 10 with high performance can be provided.

For example, when the three-dimensional device 10 is a system IC (e.g., system LSI) in which a memory and a logic circuit are combined (integrated), each of the memory and the logic circuit can be formed with a process suitable to each of them to fabricate the system IC, resulting in easy fabrication, high productivity, and mass production.

Since connecting electrodes (terminals for connection) are formed on one end of the individual thin film device layers, the adjacent thin film device layers can be electrically connected to each other easily and securely, and thus, the three-dimensional device 10 can be made three-dimensional (i.e., a circuit in the three-dimensional direction can be constructed.).

Since each layer can be deposited by selecting a conforming thin film device layer only, in comparison with the case when a three-dimensional device is fabricated by forming each layer in order on the same substrate (forming each layer directly), higher yield can be achieved.

Transferring to various types of substrate (substrate on the transfer destination side) 21 is also enabled. That is, with respect of a material on which a thin film device layer cannot be formed directly or which is not suitable for forming a thin film device layer, a material which is easy to form, a material composed of an inexpensive material, or the like, the formation by transfer is enabled. That is, since the substrate 21 has versatility, for example, an IC can be formed on a flexible substrate, and thus, IC cards or the like can be fabricated easily.

Since a glass substrate which is relatively inexpensive and which has a large area can be used as the substrate (support substrate) 1, cost can be reduced.

Although, in the example described above, the number of transfers of the transfer source layers (thin film device layers) 41 and 42 is one, respectively, in the present invention, as long as the transfer source layer 41 and the transfer source layer 42 can be deposited, the number of transfers of the transfer source layer 41 may be two or more, and the number of transfers of the transfer source layer 42 may be two or more.

For example, when the number of transfers of the transfer source layer is two, the transfer source layer on the substrate 1 is transferred to a third substrate (not shown in the drawing) excluding the substrate 1 and the substrate 21, and the transfer source layer on the third substrate is then transferred to the substrate 21. The third substrate is provided with the separable layer 2.

If the number of transfers of the transfer source layer is even, the front-back positional relation of the transfer source layer formed on the last transfer destination layer (substrate on the transfer destination side) can be set in the same state as that when the transfer source layer is first formed on the substrate (support substrate) 1.

In the present invention, the transfer source layer 41 may be directly formed on the substrate (substrate on the transfer destination side) 21, and by transferring the transfer source layer 42 to the transfer source layer 41, the three-dimensional device 10 may be fabricated.

In the present invention, three or more transfer source layers (thin film device layers) may be deposited. By increasing the number of transfer source layers (thin film device layers), integration versatility can be further improved.

Figure 16:
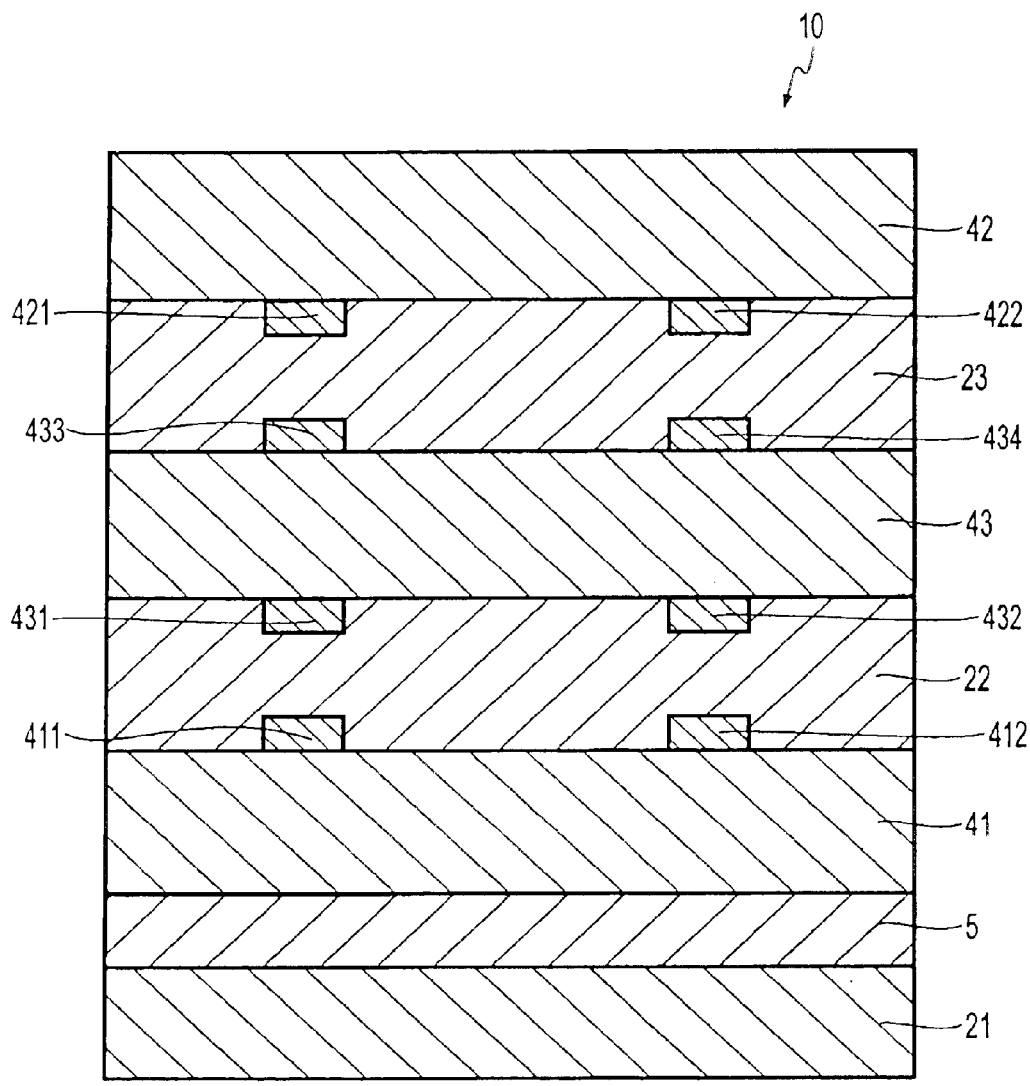
FIG. 16 is a sectional view which schematically shows a three-dimensional device having a different configuration in the present invention.

For example, when the three-dimensional device 10 has three transfer source layers (thin film device layers) and the adjacent transfer source layers are electrically connected to each other, as shown in FIG. 16, connecting electrodes (terminals for connection) are provided on both ends of a third transfer source layer (third thin film device layer) 43 which lies between the first transfer source layer (first thin film device layer) 41 and the second transfer source layer (second thin film device layer) 42. That is, connecting electrodes 431 and 432 are formed on one end (lower side in FIG. 16) of the transfer source layer 43, and connecting electrodes 433 and 434 are formed on the other end (upper side in FIG. 16).

The connecting electrode 411 of the transfer source layer 41 and the connecting electrode 431 of the transfer source layer 43 are electrically connected to each other with the conductive adhesive layer 22 therebetween, and the connecting electrode 412 of the transfer source layer 41 and the connecting electrode 432 of the transfer source layer 43 are electrically connected to each other with the conductive adhesive layer 22 therebetween. Similarly, the connecting electrode 433 of the transfer source layer 43 and the connecting electrode 421 of the transfer source layer 42 are electrically connected to each other with a conductive adhesive layer 23 therebetween, and the connecting electrode 434 of the transfer source layer 43 and the connecting electrode 422 of the transfer source layer 42 are electrically connected to each other with the conductive adhesive layer 23 therebetween.

As the conductive adhesive layer 23, an anisotropic conductive film is preferable for the same reason as that of the conductive adhesive layer 22.

In the present invention, the connecting electrode 431 and the connecting electrode 433, and the connecting electrode 432 and the connecting electrode 434, may be electrically connected directly to each other, respectively. In such a case, the connecting electrode 411 and the connecting electrode 421 are electrically connected to each other with the conductive adhesive layer 22, the connecting electrodes 431 and 433, and the conductive adhesive layer 23 therebetween; and the connecting electrode 412 and the connecting electrode 422 are electrically connected to each other with the conductive adhesive layer 22, the connecting electrodes 432 and 434, and the conductive adhesive layer 23 therebetween.

The transfer source layers 41, 42, and 43 are deposited, as described above, by the method for transferring a thin film configuration, respectively.

When three or more transfer source layers (thin film device layers) are deposited, the individual layers may be the same, all the layers may be different, or some of the layers may be the same.

Next, a second example of a three-dimensional device of the present invention will be described.

Figure 17:
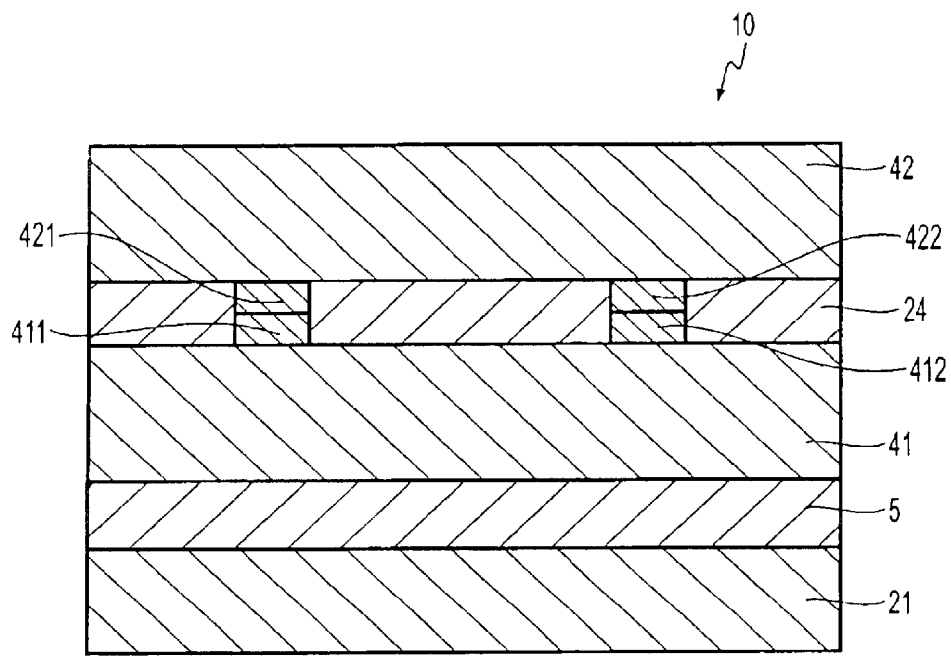
FIG. 17 is a sectional view which schematically shows a second example of a three-dimensional device in the present invention.

FIG. 17 is a sectional view which schematically shows a second example of a three-dimensional device in the present invention. The description of what is common to the first example described above will be omitted, and major differences will be described.

A three-dimensional device 10 shown in FIG. 17 is also fabricated by the method for transferring a thin film configuration in a manner similar to that of the first example.

However, in this three-dimensional device 10, in the step <A7>, the connecting electrode 411 of the first transfer source layer (first thin film device layer) 41 and the connecting electrode 421 of the second transfer source layer (second thin film device layer) 42 are brought into contact with and are electrically connected to each other, and the connecting electrode 412 of the transfer source layer 41 and the connecting electrode 422 of the transfer source layer 42 are brought into contact with and are electrically connected to each other, while the transfer source layer 41 and the transfer source layer 42 are bonded (joined) to each other with an adhesive layer 24 therebetween.

The same advantages are also obtained in the second example as in the first example described above.

Additionally in the present invention, the method for bonding (joining) the transfer source layer 41 to the transfer source layer 42 and the method for electrically connecting the corresponding electrodes to each other are not limited to those in the first example and the second example, respectively.

For example, while the connecting electrode 411 and the connecting electrode 421, and the connecting electrode 412 and the connecting electrode 422 are brought into contact with each other, respectively, the corresponding electrodes may be fixed to each other by heating, fusing, and solidifying them. Thus, the corresponding electrodes are electrically connected to each other and the transfer source layer 41 and the transfer source layer 42 are joined to each other.

Alternatively, by placing a solder (conductive wax material) between the connecting electrode 411 and the connecting electrode 421 and between the connecting electrode 412 and the connecting electrode 422, respectively, the solder may be heated, fused, and solidified. Thus, the corresponding electrodes are electrically connected to each other with the solder therebetween and the transfer source layer 41 and the transfer source layer 42 are joined to each other with the solder therebetween.

Next, a third example of a three-dimensional device of the present invention will be described.

Figure 18:
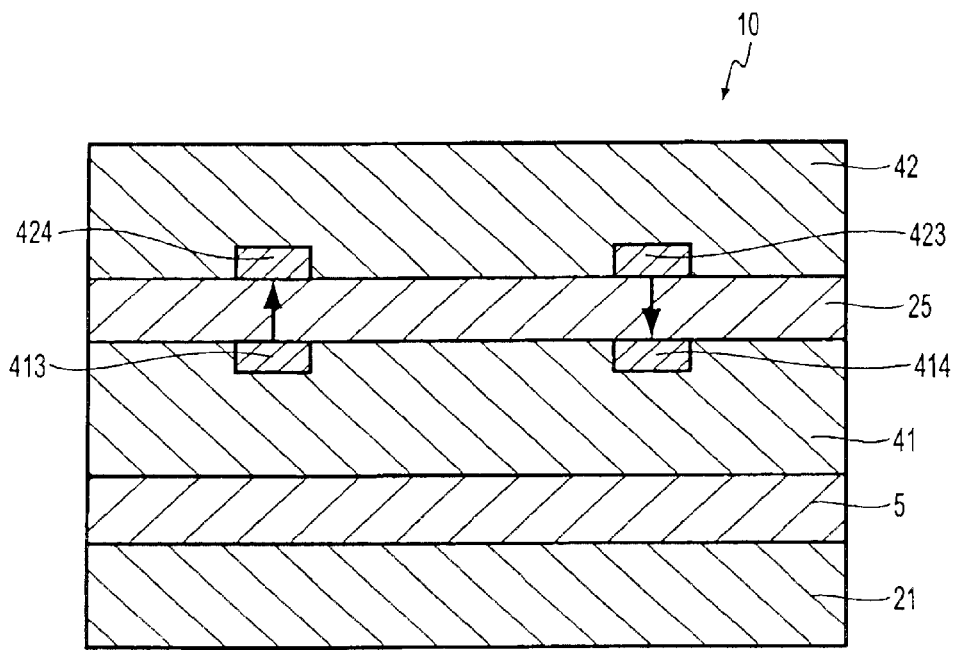
FIG. 18 is a sectional view which schematically shows a third example of a three-dimensional device in the present invention.

FIG. 18 is a sectional view which schematically shows a third example of a three-dimensional device in the present invention. The description of what is common to the first example described above will be omitted, and major differences will be described.

A three-dimensional device 10 shown in FIG. 18 is also fabricated by the method for transferring a thin film configuration in a manner similar to that of the first example.

A light-emitting section (light-emitting device) 413 and a light-receiving section (photodetector) 414 are formed on one end (upper side in FIG. 18) of a first transfer source layer (first thin film device layer) 41 of the three-dimensional device 10.

A light-emitting section (light-emitting device) 423 and a light-receiving section (photodetector) 424 are also formed on one end (lower side in FIG. 18) of a second transfer source layer (second thin film device layer) 42.

In this three-dimensional device 10, as in the step <A7> described above, while positioning is done so that corresponding light-emitting sections and light-receiving sections are opposed to each other, that is, the light-emitting section 413 is opposed to the light-receiving section 424 and the light-emitting section 423 is opposed to the light-receiving section 414, the transfer source layer 41 and the transfer source layer 42 are bonded (joined) to each other with a substantially transparent adhesive layer 25 (which transmits light emitted from the light-emitting sections 413 and 423) therebetween.

As the light-emitting sections 413 and 423 in the three-dimensional device 10, organic EL devices, for example, may be used.

Figure 19:
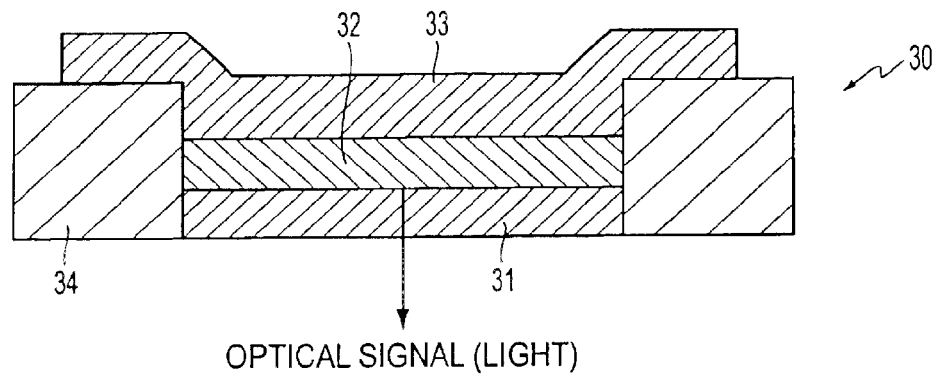
FIG. 19 is a sectional view which shows an example of a configuration of an organic EL device in the present invention.

FIG. 19 is a sectional view which shows an example of a configuration of an organic EL device.

As shown in the drawing, an organic EL device 30 includes banks 34, a transparent electrode 31 and a light-emitting layer (organic EL) 32 formed within the banks 34, and a metallic electrode 33.

In such a case, the light-emitting layer 32 is formed on the transparent electrode 31, and the metallic electrode 33 is formed on the banks 34 and the light-emitting layer 32.

The transparent electrode 31 is composed of, for example, ITO.

The light-emitting layer 32 is, for example, composed of a thin film (solid thin film) formed by heat-treating a precursor of a conjugated high-molecular organic compound which is a main constituent of the light-emitting layer 32 and a composition for an organic EL device (composition for the light-emitting layer 32) in which a fluorescent dye or the like for changing luminescent characteristics of the light-emitting layer 32 is dissolved or dispersed in a predetermined solvent (polar solvent), and by polymerizing the precursor in the composition for the organic EL device.

The metallic electrode 33 is composed of, for example, Al—Li.

The bank 34 is composed of, for example, a resin black resist.

Each of the transfer source layers 41 and 42 is provided with a driving section (driving circuit) for driving the organic EL device 30.

In the organic EL device 30, when a predetermined voltage is applied from the driving circuit to between the transparent electrode 31 and the metallic electrode 33, electrons and holes are injected into the light-emitting layer 32, and they migrate and recombine in the light-emitting layer 32 by means of an electric field caused by the voltage applied. Energy emitted during the recombination generates excitons, and energy (fluorescence/phosphorescence) is emitted when the excitons return to the ground state. That is, light is emitted. The phenomenon described above is referred to as "EL luminescence".

Figure 20:
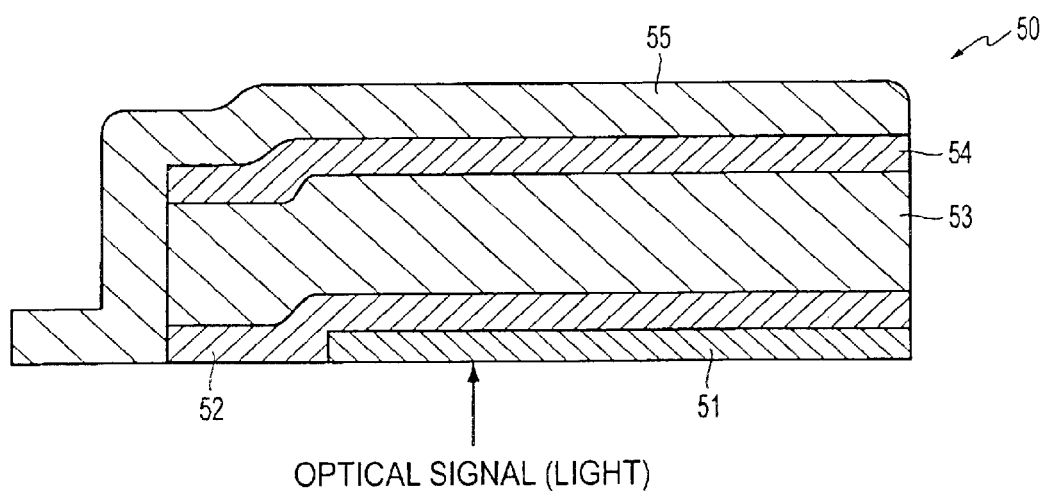
FIG. 20 is a sectional view which shows an example of a configuration of a PIN photodiode in the present invention.

As the light-receiving sections 414 and 424 in the three-dimensional device 10, for example, PIN photodiodes may be used FIG. 20 is a sectional view which shows an example of a configuration of a PIN photodiode.

As shown in the drawing, a PIN photodiode 50 includes a window electrode in the light-receiving section 51, a p-type a-SiC layer (p-type semiconductor layer) 52, an i-type a-Si layer (semiconductor layer) 53, an n-type a-SiC layer (n-type semiconductor layer) 54, and an Al—Si—Cu layer 55 which functions both as an upper electrode in the light-receiving section and as a wire (electrical wire).

The window electrode in the light-receiving section 51, the p-type a-SiC layer 52, the i-type a-Si layer 53, the n-type a-SiC layer 54, and the Al—Si—Cu layer 55 are deposited in this order from the lower side in FIG. 20. The window electrode in the light-receiving section 51 is composed of, for example, ITO.

As described above, the organic EL device 30 emits light by being driven by the driving circuit (not shown in the drawing) which is electrically connected to the organic EL device 30. That is, the organic EL device 30 sends (transmits) optical signals (light).

Light from the organic EL device 30 passes through the adhesive layer 25 and enters through the window electrode in the light-receiving section 51. That is, the light is received by the PIN photodiode 50.

The PIN photodiode 50 outputs a current having an amount corresponding to luminous energy received, that is, electrical signals (signals). (Optical signals are converted into electrical signals for output.)

Based on the signals from the PIN photodiode 50, the circuit (not shown in the drawing) connected to the PIN photodiode 50 is operated.

As shown in FIG. 18, the light from the light-emitting section 413 passes through the adhesive layer 25 and is received by the light-receiving section 424, and the light from the light-emitting section 423 passes through the adhesive layer 25 and is received by the light-receiving section 414. That is, communication occurs between the transfer source layer 41 and the transfer source layer 42 by means of light (optical signals) through the light-emitting sections 413 and 423 and the light-receiving sections 414 and 424.

The same advantages are also obtained in the third example as in the first example described above.

In the third example, since the transmission of signals between layers is performed by light (optical signals) instead of electricity (electrical signals), the fabrication is easy, and in particular, integration versatility can be further improved.

In the present invention, the light-emitting sections 413 and 423 may be composed of, in addition to organic EL devices, inorganic EL devices, light-emitting diodes (LEDs), semiconductor lasers (laser diodes), or the like.

In the present invention, the light-receiving sections 414 and 424 are not limited to PIN photodiodes, and they may be various types of photodiodes such as PN photodiodes or avalanche photodiodes, phototransistors, photoluminescence (organic photoluminescence, inorganic photoluminescence, etc.), or the like.

In the present invention, the method for bonding (joining) the transfer source layer (thin film device layer) 41 to the transfer source layer (thin film device layer) 42 is not limited to the method described above. That is, what is required is only that the transfer source layer 41 and the transfer source layer 42 be bonded (joined) to each other so that communication by light (optical signals) is enabled between the transfer source layer 41 and the transfer source layer 42.

For example, the transfer source layer 41 may be partially bonded (joined) to the transfer source layer 42. In such a case, when bonding (joining) is performed at a section other than the light-emitting sections 413 and 423 and the light-receiving sections 414 and 424, the transfer source layer 41 and the transfer source layer 42 may be bonded (joined) to each other with an opaque adhesive layer.

By providing a spacer (e.g., pillar) between the transfer source layer 41 and the transfer source layer 42, the transfer source layer 41 and the transfer source layer 42 may be bonded (joined) to each other with the spacer therebetween. In such a case, gaps are formed between the light-emitting section 413 and the light-receiving section 414 of the transfer source layer 41 and the light-receiving section 424 and the light-emitting section 423 of the transfer source layer 42.

The light-emitting section 413 and the light-receiving section 414 of the transfer source layer 41 and the light-receiving section 424 and the light-emitting section 423 of the transfer source layer 42 may be brought into contact with each other, respectively.

In the present invention, when the number of layers of the transfer source layers (thin film device layers) in the three-dimensional device is set at three or more, the configuration may be designed so that communication by light (optical signals) is enabled between nonadjacent layers.

In the present invention, the light-emitting section may be composed of a plurality of light-emitting devices having different luminescent characteristics (such as peak wavelength of light emitted), and the light-receiving section may be composed of a plurality of photodetectors for receiving light from the corresponding light-emitting devices.

In such a case, a plurality of information (signals) can be communicated simultaneously. That is, information transmission by optical communication over multiple channels is enabled.

In the present invention, a plurality of light-emitting sections having different luminescent characteristics (such as peak wavelength of light emitted) may be provided, and a plurality of light-receiving sections may be provided for receiving light from the corresponding light-emitting sections.

In the present invention, the configuration may be designed so that communication by light (optical signals), such as between the transfer source layers (thin film device layers) described above, is enabled within at least one given transfer source layer (thin film device layer).

Additionally, in each of the first to third examples, as required, terminals (connecting terminals) for electrically connecting to the exterior (for example, an external apparatus or a substrate for mounting) may be provided at a predetermined position.

For example, when the connecting terminals are provided on the substrates 21 and the connecting terminals are electrically connected to the transfer source layers (thin film device layers) 41, connecting electrodes (terminals for connection), which are not shown in the drawings, are formed on the lower end of the transfer source layers 41 in FIG. 9, FIG. 16, FIG. 17, and FIG. 18. The substrates 21 are bonded (joined) to the transfer source layers 41 so that the connecting electrodes and the connecting terminals are electrically connected to each other. The bonding (joining) between the substrates 21 and the transfer source layers 41 may be performed, for example, in the same manner as that for the bonding (joining) between the transfer source layer 41 and the transfer source layer 42.

Next, a fourth example of a three-dimensional device of the present invention will be described.

Figure 21:
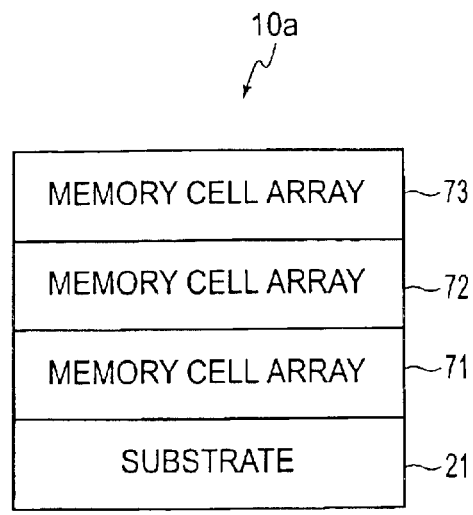
FIG. 21 is a sectional view which schematically shows a fourth example of a three-dimensional device in the present invention.

FIG. 21 is a sectional view which schematically shows a fourth example of a three-dimensional device in the present invention. The description of what is common to the first to third examples described above will be omitted and major differences will be described.

The three-dimensional device of the fourth example shown in FIG. 21 is a memory IC (memory device). A memory IC 10a includes, a substrate (substrate on the transfer destination side) 21, and a memory cell array 71, a memory cell array 72, and a memory cell array 73 deposited on the substrate 21.

The individual memory cell arrays 71, 72, and 73 are deposited in that order from the lower side in FIG. 21 by the method for transferring a thin film configuration described above. That is, the memory cell arrays 71, 72 and 73 are transfer source layers (thin film device layers).

In such a case, the substrate 21 and the memory cell array 71, the memory cell array 71 and the memory cell array 72, and the memory cell array 72 and the memory cell array 73 may be bonded (joined) in any one of the methods according to the first to third examples.

That is, in the same manner as that of the first or the second example described above, predetermined layers may be electrically connected to each other, or in the same manner as that of the third example described above, communication by light (optical signals) may be enabled between predetermined layers.

In the memory cell arrays 71, 72, and 73, memory cells which will be described below are arrayed in a matrix. In this example, the memory cell arrays 71, 72, and 73 are composed of an SRAM, respectively.

Figure 22:
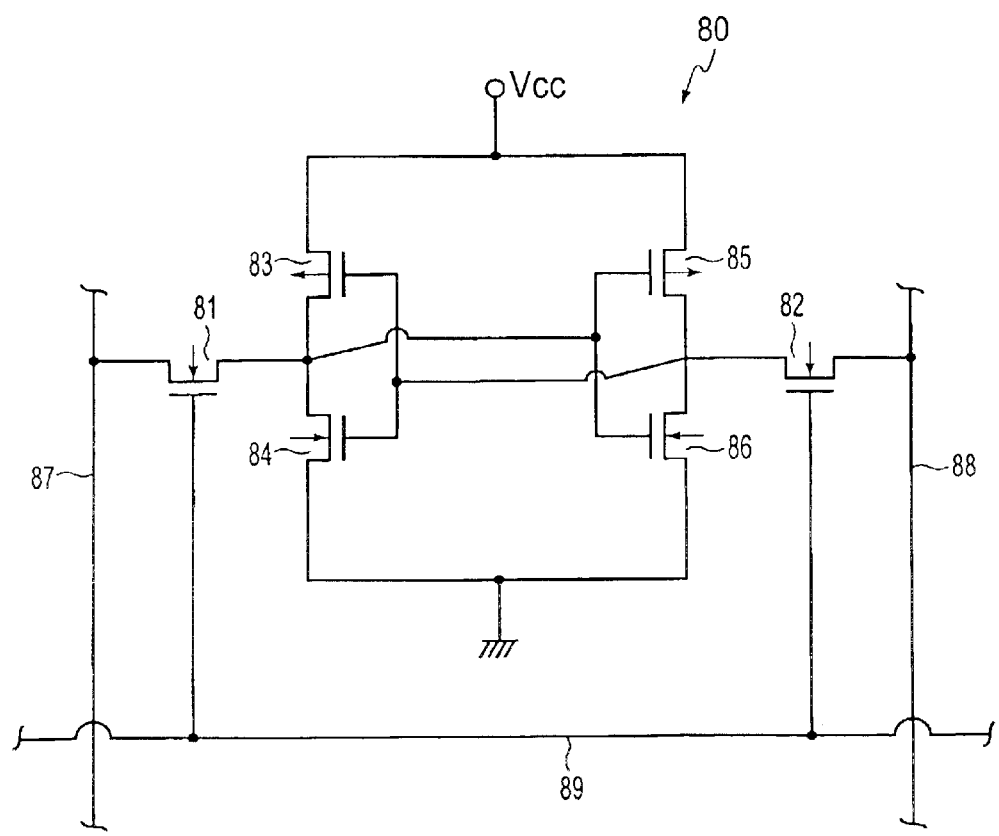
FIG. 22 is a circuit diagram which shows an example of a configuration of a memory cell (one cell) of an SRAM in the present invention.

FIG. 22 is a circuit diagram which shows an example of a configuration of a memory cell (one cell) of the SRAM.

As shown in FIG. 22, a memory cell 80 of the SRAM is a memory cell of a CMOS-type SRAM, and includes an NMOS thin film transistor (TFT) 81, an nMOS thin film transistor (TFT) 82, a pMOS thin film transistor (TFT) 83, an NMOS thin film transistor (TFT) 84, a pMOS thin film transistor (TFT) 85, NMOS thin film transistor (TFT) 86, and connecting lines therefor.

A gate of the NMOS thin film transistor 81 is connected to a word line 89, and a source or drain of the NMOS thin film transistor 81 is connected to a first bit line (data line) 87.

A gate of the nMOS thin film transistor 82 is connected to the word line 89, and a source or drain of the NMOS thin film transistor 82 is connected to a second bit line (data line) 88.

In the memory cell 80, the pMOS thin film transistor 83 and NMOS thin film transistor 84 constitute a first inverter circuit (NOT circuit), and the pMOS thin film transistor 85 and the nMOS thin film transistor 86 constitute a second inverter circuit (NOT circuit). The first inverter circuit and the second inverter circuit constitute a flip-flop circuit.

In the present invention, the memory cell arrays 71, 72, and 73 are not limited to memory arrays of SRAMs, and they may be memory cell arrays of various memories, for example, various RAMs such as DRAMs, and various ROMs such as EPROMs, $E^2$PROMs, flash memories, and mask ROMs.

In the memory IC 10a (fourth example), the same advantage is also obtained as that in the first to third examples described above.

In particular, since a plurality of memory array cells are deposited in the memory IC 10a, a memory IC with a large capacity (large-scale memory) can be obtained. That is, when a memory IC of the same capacity (the same scale) is fabricated, since the memory IC can be formed in a narrow area, the memory IC can be miniaturized.

Additionally, in the present invention, the number of memory cell array layers, that is, the number of transfer source layers (thin film device layers) which constitute the memory cell arrays is not limited to three, and it may be two, or four or more.

Next, a fifth example of a three-dimensional device of the present invention will be described.

Figure 23:
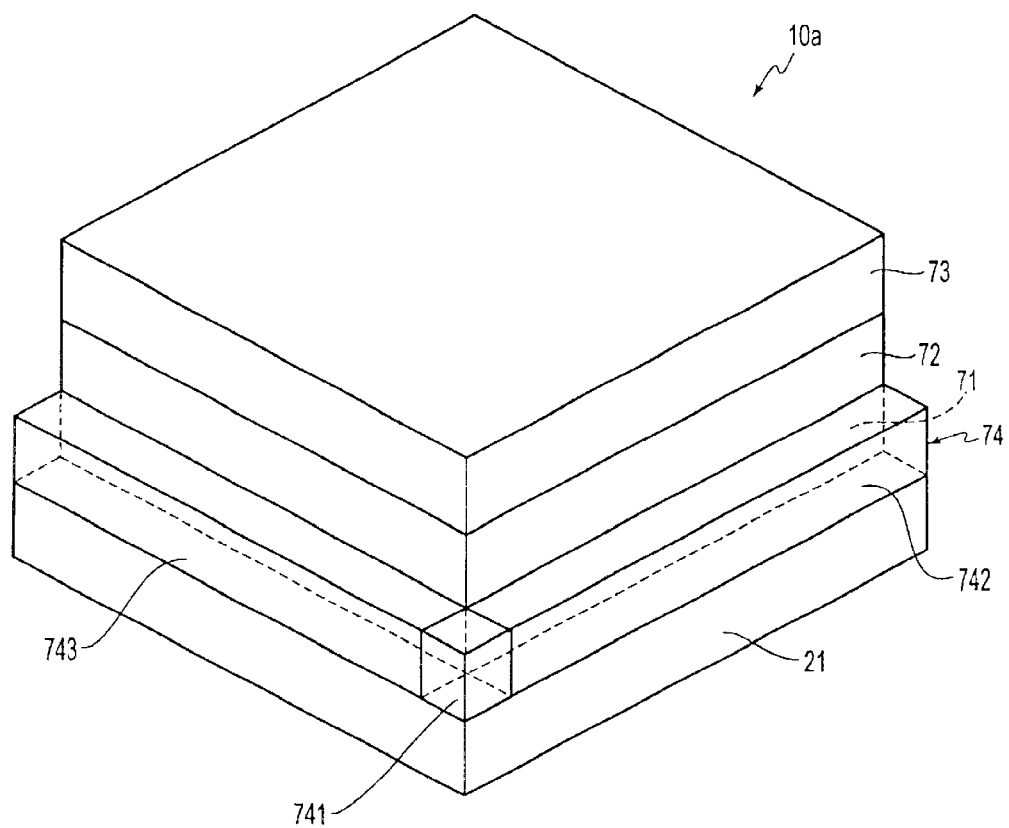
FIG. 23 is a perspective view which schematically shows a fifth example of a three-dimensional device in the present invention.

FIG. 23 is a perspective view which schematically shows a fifth example of a three-dimensional device in the present invention. The description of what is common with the fourth example described above will be omitted and major differences will be described.

The three-dimensional device of the fifth example shown in FIG. 23 is a memory IC. A memory IC 10a includes a substrate (substrate on the transfer destination side) 21, and a memory 74, a memory cell array 72, and a memory cell array 73 deposited on the substrate 21.

The memory 74 and the memory cell arrays 72 and 73 are deposited in that order from the lower side in FIG. 23 by the method for transferring a thin film configuration described above. That is, the memory 74 and the memory cell arrays 72 and 73 are transfer source layers (thin film device layers).

The memory 74 includes a memory cell array 71, an input/output control circuit (I/O) 741 for controlling data input/output, a row decoder 742 for designating row addresses (addresses in the row direction) in the target memory cell, and a column decoder 743 for designating column addresses (addresses in the column direction) in the target memory cell.

In the memory IC 10a, the memory cell arrays 71, 72, and 73 constitute one memory cell array.

All of the memory cell arrays 71, 72, and 73 are driven by the input/output control circuit 741, the row decoder 742, and the column decoder 743. Therefore, in the memory IC 10a, the memory 74 and memory cell arrays 72 and 73 constitute one memory.

In the memory IC 10a (fifth example), the same advantage is also obtained as that in the fourth example.

In the present invention, the number of layers of memory cell arrays, that is, the number of transfer source layers (thin film device layers) constituting memory cell arrays, are not limited to two, and may be one, or three or more. In other words, in the present invention, it is acceptable if the total number of layers of transfer source layers (thin film device layers) constituting the memory array cell and of transfer source layers (thin film device layers) constituting the memory is two or more.

Next, a sixth example of a three-dimensional device of the present invention will be described.

Figure 24:
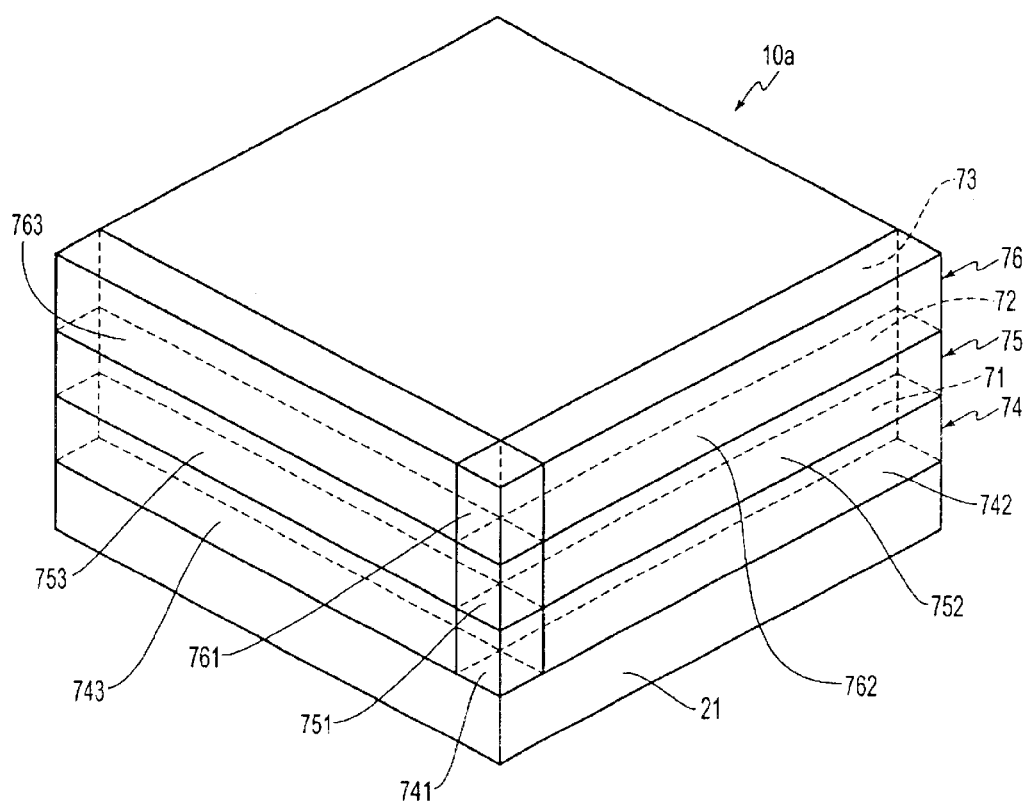
FIG. 24 is a perspective view which schematically shows a sixth example of a three-dimensional device in the present invention.

FIG. 24 is a perspective view which schematically shows a sixth example of a three-dimensional device in the present invention. The description of what is common with the fourth example shown in FIG. 21 will be omitted and major differences will be described.

The three-dimensional device of the sixth example shown in FIG. 24 is a memory IC. A memory IC 10a includes a substrate (substrate on the transfer destination side) 21, and a memory 74, a memory 75, and a memory 76 deposited on the substrate 21.

The memories 74, 75, and 76 are deposited in that order from the lower side in FIG. 24 by the method for transferring a thin film configuration described above. That is, the memories 74, 75, and 76 are transfer source layers (thin film device layers).

The memory 74 includes a memory cell array 71, an input/output control circuit (I/O) 741 for controlling data input/output, a row decoder 742 for designating row addresses (addresses in the row direction) in the target memory cell, and a column decoder 743 for designating column addresses (addresses in the column direction) in the target memory cell.

The memory cell array 71 is driven by the input/output control circuit 741, the row decoder 742, and the column decoder 743.

Similarly to the memory 74, the memory 75 includes a memory cell array 72, an input/output control circuit (I/O) 751, a row decoder 752, and a column decoder 753.

The memory cell array 72 is driven by the input/output control circuit 751, the row decoder 752, and the column decoder 753.

Similarly to the memory 74, the memory 76 includes a memory cell array 73, an input/output control circuit (I/O) 761, a row decoder 762, and a column decoder 763.

The memory cell array 73 is driven by the input/output control circuit 761, the row decoder 762, and the column decoder 763.

In the memory IC 10a (sixth example), the same advantages are also obtained as in the fourth example.

In the present invention, the number of layers of memories, that is, the number of transfer source layers (thin film device layers) which constitute memories is not limited to three, and may be two, or four, or more.

Next, a seventh example of a three-dimensional device of the present invention will be described.

Figure 25:
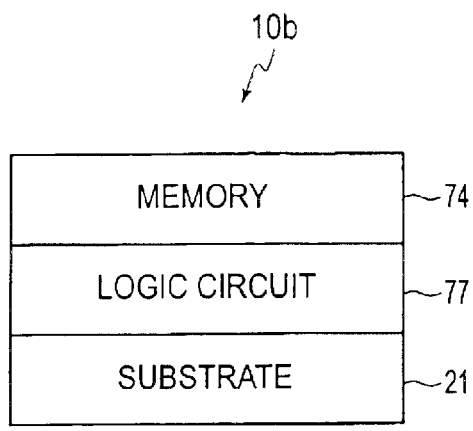
FIG. 25 is a schematic diagram which shows a seventh example of a three-dimensional device in the present invention.

FIG. 25 is a schematic diagram which shows a seventh example of a three-dimensional device in the present invention. The description of what is common with the fourth to sixth examples shown in FIGS. 21 to 23 will be omitted and major differences will be described.

The three-dimensional device of the seventh example shown in FIG. 25 is a system IC (system LSI). A system IC (system LSI) 10b includes a substrate (substrate on the transfer destination side) 21, a logic circuit 77 and a memory 74 deposited on the substrate 21.

The logic circuit 77 and the memory 74 are deposited in that order from the lower side in FIG. 25 by the method for transferring a thin film configuration described above. That is, the logic circuit 77 and the memory 74 are transfer source layers (thin film device layers).

The logic circuit 77 is composed of, for example, a CPU.

The memory 74 is driven and controlled by the logic circuit 77.

In the system IC 10b (seventh example), the same advantages are also obtained as in the fourth to sixth examples.

In particular, in the system IC 10b, the logic circuit 77 and the memory 74 can be formed by required (suitable) design parameters, design rules (minimum line width), and fabricating processes. That is, the logic circuit 77 and the memory 74 can be formed by different design parameters, different design rules, and different fabricating processes.

In the present invention, the number of layers of the logic circuit, that is, the number of transfer source layers (thin film device layers) constituting the logic circuit, is not limited to one, and may be two or more.

In the present invention, the number of layers of the memories, that is, the number of transfer source layers (thin film device layers) constituting the memory, is also not limited to one, and may be two or more.

Next, an eighth example of a three-dimensional device of the present invention will be described.

Figure 26:
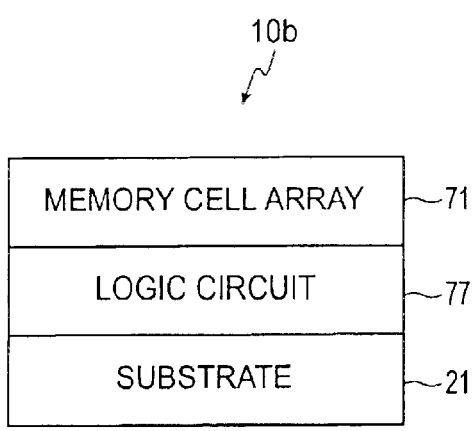
FIG. 26 is a schematic diagram which shows an eighth example of a three-dimensional device in the present invention.

FIG. 26 is a schematic diagram which shows an eighth example of a three-dimensional device of the present invention. The description of what is common to the seventh example shown in FIG. 25 will be omitted and major differences will be described.

The three-dimensional device of the eighth example shown in FIG. 26 is a system IC (system LSI). A system IC (system LSI) 10b includes a substrate (substrate on the transfer destination side) 21, and a logic circuit 77 and a memory cell array 71 deposited on the substrate 21.

The logic circuit 77 and the memory cell array 71 are deposited, in that order, from the lower side in FIG. 26 by the method for transferring a thin film configuration described above. That is, the logic circuit 77 and the memory cell array 71 are transfer source layers (thin film device layers).

The memory cell array 71 is driven and controlled by the logic circuit 77.

That is, the logic circuit 77 includes, in relation to the memory cell array 71, an input/output control circuit (I/O), which is not shown in the drawing, for controlling data input/output, a row decoder, which is not shown in the drawing, for designating row addresses (addresses in the row direction) in the target memory cell, and a column decoder, which is not shown in the drawing, for designating column addresses (addresses in the column direction) in the target memory cell.

The logic circuit 77 is composed of, for example, a CPU.

In the system IC 10b (eighth example), the same advantages are also obtained as in the seventh example.

In the present invention, the number of layers of the logic circuit, that is, the number of transfer source layers (thin film device layers) constituting the logic circuit is not limited to one, and may be two or more.

In the present invention, the number of layers of the memory cell array, that is, the number of transfer source layers (thin film device layers) is not limited to one, and may be two or more.

Next, a ninth example of a three-dimensional device of the present invention will be described.

Figure 27:
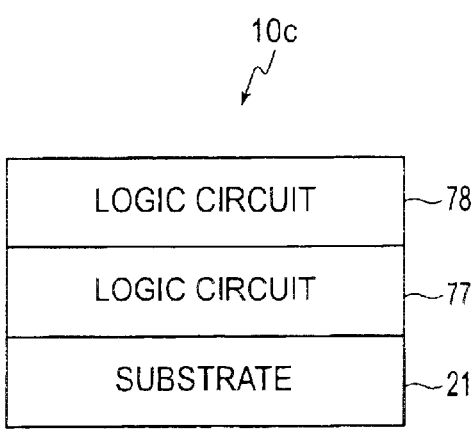
FIG. 27 is a schematic diagram which shows a ninth example of a three-dimensional device in the present invention.

FIG. 27 is a schematic diagram which shows a ninth example of a three-dimensional device in the present invention. The description of what is common with the fourth to sixth examples shown in FIGS. 21 to 23 will be omitted, and major differences will be described.

The three-dimensional device of the ninth example shown in FIG. 27 is an IC (LSI). An IC (LSI) 10c includes a substrate (substrate on the transfer destination side) 21, and a logic circuit 77 and a logic circuit 78 deposited on the substrate 21.

The logic circuits 77 and 78 are deposited, in that order, from the lower side in FIG. 27 by the method for transferring a thin film configuration described above. That is, the logic circuits 77 and 78 are transfer source layers (thin film device layers).

The logic circuits 77 and 78 are composed of, for example, CPUs.

In the IC 10c (ninth example), the same advantages are also obtained as in the fourth to sixth examples.

In particular, in the IC 10c, since a plurality of logic circuits are deposited, a large-scale logic circuit, that is, an IC (LSI) having a large scale can be obtained. In other words, when an IC having the same scale is fabricated, the IC can be formed in a narrow area, and thus, miniaturization of ICs can be achieved.

In the present invention, the number of layers of logic circuits, that is, the number of transfer source layers (thin film device layers) constituting logic circuits is not limited to two, and may be three or more.

In the fourth to ninth examples described above, in the present invention, at least one other transfer source layer (thin film device layer) may be further formed.

In such a case, the position of the other transfer source layer (thin film device layer) is not specifically restricted.

As the other transfer source layers (thin film device layers), for example, various types of sensors such as optical sensors or magnetic sensors may be used.

Although three-dimensional devices in the present invention have been described based on the examples shown in the drawings, the present invention is not limited to this.

For example, in the present invention, when the number of transfer source layers (thin film device layers) of the three-dimensional device is set at three or more, predetermined transfer source layers may be electrically connected hereinafter referred to as being "electrically connected") in a manner similar to that in the first example or the second example, and the space between other transfer source layers may be configured so that communication by light (optical signals) is enabled (hereinafter referred to "optically connected") in a manner similar to that in the third example.

In the present invention, portions of the predetermined transfer source layers may be electrically connected and the rest may be optically connected.

In the present invention, when at least one layer in the transfer source layers (thin film device layers) constitutes a memory or a memory cell array, a plurality of types of memories or memory cell arrays may be formed in the layer.

In the present invention, when at least two layers in the transfer source layers (thin film device layers) constitute memories or memory cell arrays, a plurality of types of memories or memory cell arrays may be deposited.

In the present invention, at least one layer in a plurality of transfer source layers (thin film device layers) constituting a three-dimensional device is transferred by the method for transferring a thin film configuration (transfer technique).

The transfer method in the present invention is not limited to the method described above.

Industrial Applicability

As described above, in accordance with a three-dimensional device in the present invention, since a thin film device layer is deposited by a transfer method, three-dimensional devices (such as three-dimensional IC) can be easily fabricated.

In particular, since the individual thin film device layers can be formed independently, there is no need to take into consideration potential adverse effects on lower layers (thin film device layers on the lower side) as in conventional devices, and fabrication conditions are flexible.

In the present invention, since a plurality of thin film device layers are deposited, integration versatility can be improved.

In the present invention, since the individual thin film device layers can be formed on different substrates, the individual thin film device layers can be fabricated with optimal device parameters, optimal design rules, and optimal fabricating processes, and thus, a highly reliable device with high performance can be provided.

In the present invention, since each layer can be deposited by selecting a conforming thin film device layer only, in comparison with the case when a three-dimensional device is fabricated by forming each layer in order on the same substrate (forming each layer directly), higher yield can be achieved.

What is claimed is:

1. A method of forming a three-dimensional device, the device including at least a first thin film device layer having a plurality of first electrodes and a second thin film device layer having a plurality of second electrodes, each deposited in a thickness direction, the method comprising:

forming the first thin film device layer on a first substrate;

forming the second thin film device layer on a second substrate with a separable layer therebetween;

adhering the first thin film device layer to the second thin film device layer such that the plurality of first electrodes are electrically connected to the plurality of second electrodes; and irradiating the separable layer with light to cause ablation in at least one of the separable layer and at an interface between the separable layer and the second substrate such that the second thin film device layer is transferred from the second substrate to the first substrate, and formed on the first thin film device layer.

2. A method of forming a three-dimensional device, the device including at least a first thin film device layer having a plurality of first electrodes and a second thin film device layer having a plurality of second electrodes constituting a three-dimensional circuit, each thin film device layer deposited in a thickness direction, each thin film device layer constituting a circuit disposed in a predetermined region extending in a planar direction, the method comprising:

adhering the first thin film device layer to the second thin film device layer such that the plurality of first electrodes are electrically connected to the plurality of second electrodes; and depositing the second thin film device layer on the first thin film device layer by ablation in a separable layer on which the second thin film device layer is formed.

3. The method of forming a three-dimensional device according to claim 1, further comprising irradiating the separable layer with light to cause the ablation in at least one of the separable layer and at an interface between the separable layer and the second substrate so that the second thin film device layer on the second substrate is transferred to the first substrate of the three-dimensional device.

4. The method of forming a three-dimensional device according to claim 3, the ablation of the separable layer being caused by one of breakage and weakening of interatomic or intermolecular bonds in a material constituting the separable layer.

5. The method of forming a three-dimensional device according to claim 3, the ablation of the separable layer being caused by evolution of gas from a material constituting the separable layer.

6. The method of forming a three-dimensional device according to claim 3, the light being a laser beam.

7. The method of forming a three-dimensional device according to claim 3, the separable layer comprising one of amorphous silicon, ceramic, metal, and organic polymeric material.

8. The method of forming a three-dimensional device according to claim 1, further comprising electrically connecting an adjacent thin film device layer to the first and second thin film device layers to using electrodes on each thin film device layer.

9. The method of forming a three-dimensional device according to claim 8, the electrically connecting further providing the electrodes on both surfaces of each thin film device layer.

10. The method of forming a three-dimensional device according to claim 8, the three dimensional device further comprising an anisotropic conductive film, the method further comprising joining two adjacent thin film device layers to each other with the anisotropic conductive film therebetween.

11. The method of forming a three-dimensional device according to claim 1, in two selected layers of the thin film device layers, a first layer has a light-emitting section and a second layer has a light-receiving section, the light-emitting section and the light-receiving section enabling optical communication between the two layers.

12. The method of forming a three-dimensional device according to claim 1, the second thin film device layer deposited by transferring being formed simultaneously with at least one other of the thin film device layers.

13. The method of forming a three-dimensional device according to claim 1, at least one of the thin film device layers comprising a plurality of thin film transistors.

14. The method of forming a three-dimensional device according to claim 1, at least one of the thin film device layers comprising a memory cell array.

15. The method of forming a three-dimensional device according to claim 1, a plurality of layers among the thin film device layers comprising one memory.

16. The method of forming a three-dimensional device according to claim 1, at least one of the thin film device layers comprising a memory cell array, and at least one other thin film device layers comprises a logic circuit.

17. The method of forming a three-dimensional device according to claim 16, the logic circuit being capable of driving the memory cell array.

18. The method of forming a three-dimensional device according to claim 16, the logic circuit and the memory cell array being formed in accordance with different design rules.

19. The method of forming a three-dimensional device according to claim 16, the logic circuit and the memory cell array being formed in accordance with different design parameters.

20. The method of forming a three-dimensional device according to claim 16, the logic circuit and the memory cell array being formed by different fabricating processes.

21. A method for manufacturing a three-dimensional device, comprising:

forming a plurality of thin film device layers on a first substrate, the plurality of thin film device layers including at least a first thin film device layer having a plurality of first electrodes and a second thin film device layer having a plurality of second electrodes;

forming the second thin film device layer on a second substrate with a separable layer therebetween;

adhering the first thin film device layer to the second thin film device layer such that the plurality of first electrodes are electrically connected to the plurality of second electrodes; and irradiating the separable layer with light to cause ablation in at least one of the separable layer and at an interface so that the second thin film device layer is transferred to the first substrate.

22. The method for manufacturing a three-dimensional device according to claim 21, the ablation of the separable layer being caused by one of breakage and weakening of interatomic or intermolecular bonds in a material constituting the separable layer.

23. The method for manufacturing a three-dimensional device according to claim 21, the ablation of the separable layer being caused by evolution of gas from a material constituting the separable layer.

24. The method for manufacturing a three-dimensional device according to claim 21, the light being a laser beam.

25. The method for manufacturing a three-dimensional device according to claim 21, the second thin film device layer being deposited by transferring being formed simultaneously with at least one other of the thin film device layers.

26. The method for manufacturing a three-dimensional device according to claim 21, at least one of the plurality of thin film device layers having a light-emitting section.

27. The method for manufacturing a three-dimensional device according to claim 21, further comprising a step of forming a light-emitting section in at least one of the plurality of thin film device layers.

* * * * *